(12) United States Patent
Ma et al.

(10) Patent No.: US 12,219,753 B2
(45) Date of Patent: Feb. 4, 2025

(54) METHOD FOR FABRICATING A SEMICONDUCTOR DEVICE HAVING A SINGLE CRYSTAL STORAGE CONTACT

(71) Applicant: Samsung Electronics Co., Ltd., Suwon-si (KR)

(72) Inventors: Jin Won Ma, Hwaseong-si (KR); Ja Min Koo, Hwaseong-si (KR); Dae Young Moon, Seoul (KR); Kyu Wan Kim, Suwon-si (KR); Bong Hyun Kim, Incheon (KR); Young Seok Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/538,358

(22) Filed: Dec. 13, 2023

(65) Prior Publication Data

US 2024/0114679 A1    Apr. 4, 2024

Related U.S. Application Data

(63) Continuation of application No. 17/355,451, filed on Jun. 23, 2021, now Pat. No. 11,877,443.

(30) Foreign Application Priority Data

Jul. 29, 2020    (KR) .................. 10-2020-0094161

(51) Int. Cl.
*H10B 12/00* (2023.01)
(52) U.S. Cl.
CPC ........... *H10B 12/485* (2023.02); *H10B 12/37* (2023.02)

(58) Field of Classification Search
CPC ............ H10B 12/0335; H10B 12/315; H10B 12/482; H10B 12/485; H10B 12/337
(Continued)

(56) References Cited

U.S. PATENT DOCUMENTS 6,069,060 A    5/2000    Matsumoto et al.
6,174,790 B1   1/2001    Yang
(Continued)

FOREIGN PATENT DOCUMENTS

KR    100414947 B1    1/2004
KR    2004-0097113 A   11/2004
(Continued)

OTHER PUBLICATIONS

Korean Office Action dated Jun. 19, 2024 for corresponding Korean Patent Application No. 10-2020-0094161.

*Primary Examiner* — Hoai V Pham
(74) *Attorney, Agent, or Firm* — HARNESS, DICKEY & PIERCE, P.L.C.

(57) ABSTRACT

A semiconductor memory device includes a substrate including an element separation film and an active region defined by the element separation film, a bit line structure on the substrate, a trench in the element separation film and the active region, the trench on at least one side of the bit line structure and including a first portion in the element separation film and a second portion in the active region, a bottom face of the first portion placed above a bottom face of the second portion, a single crystal storage contact filling the trench, and an information storage element electrically connected to the single crystal storage contact.

20 Claims, 19 Drawing Sheets

(58) Field of Classification Search
USPC .......................................................... 438/256
See application file for complete search history.

(56) References Cited

U.S. PATENT DOCUMENTS

| | | | |
|---|---|---|---|
| 6,638,861 | B1 | 10/2003 | Ngo et al. |
| 8,357,613 | B2 | 1/2013 | Choi et al. |
| 8,975,173 | B2 * | 3/2015 | Shin .................. H01L 21/76879 |
| | | | 438/589 |
| 9,287,163 | B2 | 3/2016 | Kim |
| 2018/0158826 | A1 | 6/2018 | Cho et al. |
| 2021/0027832 | A1 | 1/2021 | Wang et al. |

FOREIGN PATENT DOCUMENTS

| | | |
|---|---|---|
| KR | 2007-0062149 A | 6/2007 |
| KR | 2008-0112879 A | 12/2008 |
| KR | 2012-0121793 A | 11/2012 |
| KR | 2016-0057545 A | 5/2016 |
| KR | 2018-0070098 A | 6/2018 |
| KR | 2020-0038736 A | 4/2020 |

\* cited by examiner

METHOD FOR FABRICATING A SEMICONDUCTOR DEVICE HAVING A SINGLE CRYSTAL STORAGE CONTACT

CROSS-REFERENCE TO RELATED APPLICATION

This is a continuation of U.S. application Ser. No. 17/355,451, filed Jun. 23, 2021, which claims the benefit of priority under 35 U.S.C. § 119 to Korean Patent Application No. 10-2020-0094161, filed on Jul. 29, 2020 in the Korean Intellectual Property Office, the entire contents of each of which are herein incorporated by reference in their entirety.

BACKGROUND

Some example embodiments relate to a semiconductor device and a method for fabricating the same.

As a semiconductor element is gradually highly integrated, individual circuit patterns are further miniaturized to implement more semiconductor elements in the same area. That is, as the degree of integration of the semiconductor element increases, design rules of the components of the semiconductor element decrease.

In a highly scaled semiconductor element, a process of forming a plurality of wiring lines and a plurality of buried contacts (BC) interposed between them becomes gradually complicated and difficult.

SUMMARY

Some example embodiments provide a semiconductor device in which reliability is improved by irradiating a laser onto a storage contact.

Alternatively or additionally, some example embodiments provide a method for fabricating a semiconductor device in which reliability is improved by irradiating a laser onto a storage contact.

According to some example embodiments, a semiconductor memory device includes a substrate including an element separation film and an active region defined by the element separation film, a bit line structure on the substrate, a trench in the element separation film and the active region, the trench on at least one side of the bit line structure and including a first portion in the element separation film and a second portion in the active region, a bottom face of the first portion placed above a bottom face of the second portion, a single crystal storage contact filling the trench, and an information storage element electrically connected to the single crystal storage contact.

According to some example embodiments, a semiconductor memory device includes a substrate, a first element separation film and a second element separation film which are in the substrate and are adjacent to each other, a trench which includes a first portion in the first element separation film and a second portion in the substrate between the first element separation film and the second element separation film, a bottom face of the first portion above a bottom face of the second portion, connecting side walls for connecting the bottom face of the first portion with the bottom face of the second portion defined by the first element separation film, and a storage contact which fills the trench. The substrate and the storage contact include single crystal silicon.

According to some example embodiments, a method for fabricating a semiconductor device includes forming a bit line structure on a substrate, the substrate including an element separation film, forming a trench in the element separation film and in the substrate on at least one side of the bit line structure, the trench including a first portion in the element separation film and a second portion in the substrate, a bottom face of the first portion above a bottom face of the second portion, forming a storage contact in the trench, irradiating the storage contact with a laser to recrystallize the storage contact, and forming a landing pad on the storage contact. The storage contact is a single crystal storage contact.

However, inventive concepts are not restricted to the one set forth herein. The above and other aspects of example embodiments will become more apparent to one of ordinary skill in the art to which the inventive concepts pertains by referencing the detailed description given below.

BRIEF DESCRIPTION OF THE DRAWINGS

The above and other aspects and features of example embodiments will become more apparent by describing in detail some example embodiments thereof referring to the attached drawings, in which.

DETAILED DESCRIPTION OF EXAMPLE EMBODIMENTS

Figure 1:
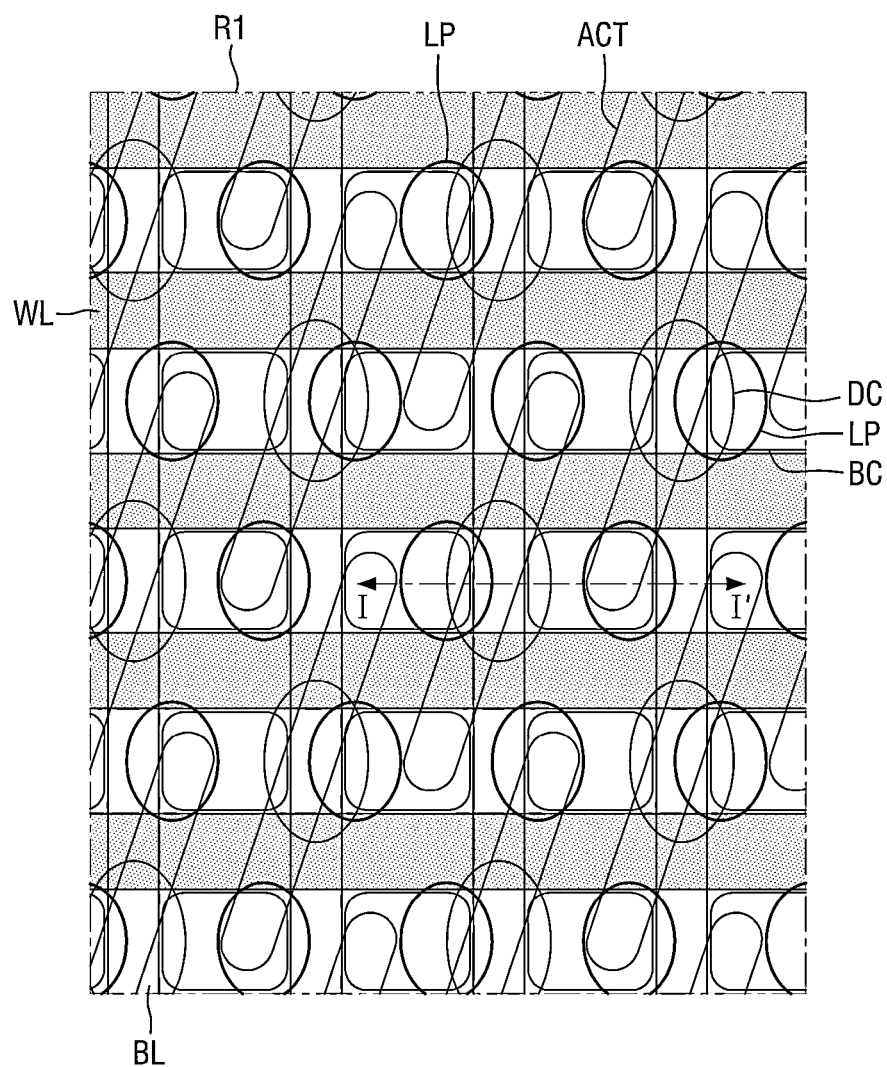
FIG. 1 is a schematic layout diagram of a semiconductor device according to some example embodiments.
Figure 1:
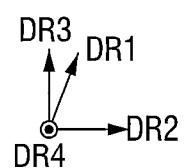

Although a DRAM (Dynamic Random Access Memory) is shown as an example in the drawings of a semiconductor device according to some example embodiments, inventive concepts are not limited thereto. For example, a semiconductor device may be or include other memory, such as nonvolatile memory such as hysteresis-based memory.

Figure 2:
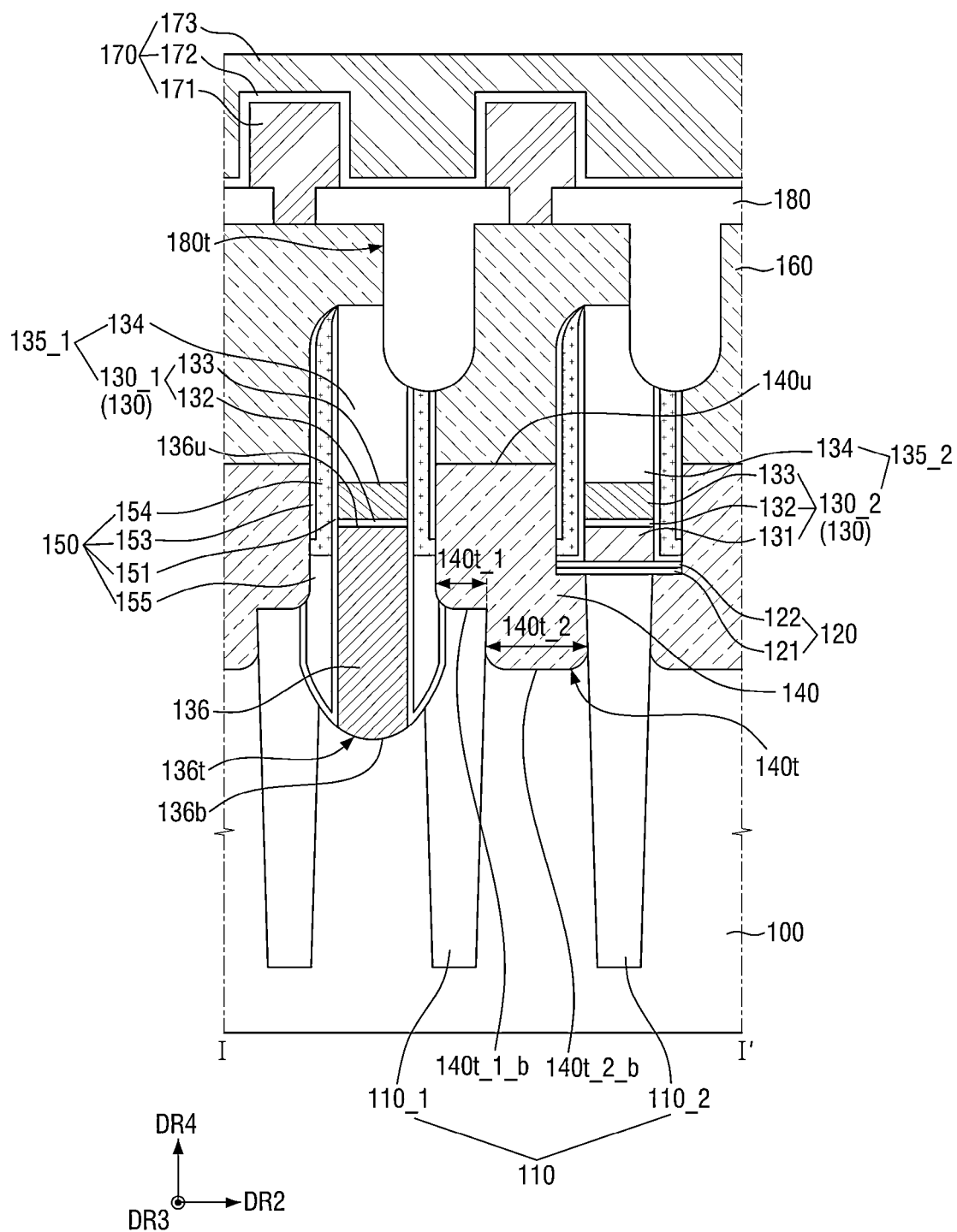
FIG. 2 is a cross-sectional view taken along a line I-I' of FIG. 1.

FIG. 1 is a schematic layout diagram of a semiconductor device according to some example embodiments. FIG. 2 is a cross-sectional view taken along a line I-I' of FIG. 1.

Referring to FIG. 1, the semiconductor device according to some example embodiments may include a plurality of active regions ACT. The active regions ACT may be defined by an element separation film (110 of FIG. 2) formed inside/within a substrate (100 of FIG. 2). The active region ACT may extend in a first direction DR1.

With the reduction of design rules of the semiconductor device, the active region ACT may be placed in the form of a bar of a diagonal line or oblique line, as shown.

On the active region ACT, a plurality of gate electrodes may be placed across the active region ACT. The plurality of gate electrodes may extend in a second direction DR2 to be parallel to each other. The plurality of gate electrodes may be, for example, a plurality of word lines WL. The second direction DR2 may intersect the first direction DR1 at an angle that is, or is not, 90 degrees. For example, the second direction DR2 may intersect the first direction DR1 at an angle greater than 45 degrees but less than 90 degrees, for example at an angle of 50 degrees, 60 degrees, 70 degrees, or 80 degrees, or at any angle between 45 degrees and 90 degrees.

The word lines WL may be paced at equal intervals, and may have a specific (or, alternatively, predetermined) pitch. A width of the word lines WL or an interval between the word lines WL may be determined according to the design rules and may be based on, for example, capabilities such as photolithographic capabilities of the equipment/tools used in the fabrication of the semiconductor device.

A plurality of bit lines BL extending in a third direction DR3 orthogonal to the word line WL may be placed on the word line WL. The plurality of bit lines BL may extend in the third direction DR3 to be parallel to each other. The third direction DR3 may intersect the second direction DR2 at an angle of 90 degrees; however, example embodiments are not limited thereto.

The bit lines BL may be placed at equal intervals, and may have a specific (or, alternatively, predetermined) pitch. The width of the bit line BL or the interval between the bit lines BL may be determined according to design rules and may be based on, for example, capabilities such as photolithographic capabilities of the equipment/tools used in the fabrication of the semiconductor device.

The semiconductor devices according to some example embodiments may include various contact arrangements formed on the active region ACT. The various contact arrangements may include, for example, a direct contact (DC), a buried contact (BC), a landing pad (LP) and/or the like.

The direct contact DC may be placed in a central portion of the active region ACT. The direct contact DC may mean or correspond to a contact that electrically connects (e.g., directly connects) the active region ACT to the bit line BL.

The buried contact BC may be placed at both ends of the active region ACT. The buried contact BC may be formed to overlap the active region ACT and the element separation film (110 of FIG. 2) between the adjacent word lines WL and between the adjacent bit lines BL. The buried contact BC may be placed between two adjacent bit lines BL of a plurality of bit lines BL. The buried contact BC may mean or correspond to a contact that connects (e.g., electrically and/or directly connects) the active region ACT to a lower electrode (171 of FIG. 2) of the information storage element.

The landing pads LP may be placed adjacent to both ends of the active region ACT to partially overlap the buried contact BC. The landing pad LP may be placed between the active region ACT and the buried contact BC, and may be placed between the buried contact BC and the lower electrode (171 of FIG. 2) of the information storage element. The landing pad LP may increase a contact area between the buried contact BC and the active region ACT, and a contact resistance between the active region ACT and the lower electrode (171 of FIG. 2) of the information storage element may decrease accordingly.

A plurality of bit lines BL extending in a third direction DR3 orthogonal to the word line WL may be placed on the word line WL. The plurality of bit lines BL may extend in the third direction DR3 to be parallel to each other.

The bit lines BL may be placed at equal intervals, and may have a specific (or, alternatively, predetermined) pitch. The width of the bit lines BL or the interval between the bit lines BL may be determined according to design rules and may be based on, for example, capabilities such as photolithographic capabilities of the equipment/tools used in the fabrication of the semiconductor device.

Referring to FIGS. 1 and 2, the semiconductor device according to some example embodiments may include a substrate 100, an element separation film 110, an insulating pattern 120, a word line WL, bit line structures 135_1 and, 135_2, a bit line contact 136, a storage contact 140, a spacer structure 150, a storage pad 160, an interlayer insulating film 180 and an information storage element 170.

The substrate 100 may be or include an undoped or lightly doped bulk silicon or SOI (silicon-on-insulator). In contrast, although the substrate 100 may be a or include silicon substrate or may include other materials, for example, silicon germanium, SGOI (silicon germanium on insulator), indium antimonide, lead tellurium compounds, indium arsenide, indium phosphide, gallium arsenide or gallium antimonide, example embodiments are not limited thereto. In the following explanation, the substrate 100 will be explained as a silicon substrate.

The element separation film 110 may be formed in the substrate 100. The element separation film 110 may have an STI (shallow trench isolation) structure having good, e.g. excellent, element separation characteristics. The element separation film 110 may be formed or deposited with a chemical vapor deposition (CVD) process such as high density plasma (HDP) deposition process and/or with a spin-on glass (SOG) process. The element separation film 110 may define an active region ACT inside the substrate 100. The element separation film 110 may include a first element separation film 110_1 and a second element separation film 110_2 that are adjacent to each other.

The active region ACT defined by the element separation film 110 may have a long island form including a short axis and a long axis, as shown in FIG. 1. The active region ACT may have an oblique line form to have an angle of less than 90 degrees with respect to the word line WL formed in the element separation film 110. Also, the active region ACT may have an oblique line form to have an angle of less than 90 degrees with respect to the bit line BL formed on the element separation film 110. For example, the active region ACT may extend in the first direction DR1 having a specific (or, alternatively, predetermined) angle in the second direction DR2 and the third direction DR3.

Although the element separation film 110 may include, for example, at least one of a silicon oxide film, a silicon nitride film and a silicon oxynitride film, example embodiments are not limited thereto.

Although FIG. 2 shows that the element separation film 110 is formed as a single insulating film, this is only for convenience of explanation, and example embodiments are not limited thereto.

The insulating pattern 120 may be formed on the substrate 100 and a second element separation film 110_2. The insulating pattern 120 may extend along an upper face of the substrate 100 and an upper face of the second element separation film 110_2 in a region in which the bit line structures 135_1 and 135_2 and the storage contact 140 are not formed. The insulating pattern 120 may include a region that overlaps the second element separation film 110_2, and a region that does not overlap the second element separation film 110_2.

Although the insulating pattern 120 may be a single film, it may be multi-films including a first insulating film 121 and a second insulating film 122, as shown in FIG. 2. The first insulating film 121 may be or include, for example, a silicon oxide. The second insulating film 122 may include a material having etching selectivity different from the first insulating film 121. For example, the second insulating film 122 may be or include silicon nitride. The insulating pattern 120 may be formed with a CVD process; however, example embodiments are not limited thereto.

The bit line structures 135_1 and 135_2 may be placed on the substrate 100, the element separation film 110 and the insulating pattern 120. The bit line structures 135_1 and 135_2 may include a first bit line structure 135_1 and a second bit line structure 135_2. The first bit line structure 135_1 and the second bit line structure 135_2 may be placed alternately in the second direction DR2. For example, the second bit line structure 135_2 may be placed between the first bit line structures 135_1 adjacent to each other in the second direction DR2.

The first bit line structure 135_1 may be placed on, e.g. directly on, the bit line contact 136. The second bit line structure 135_2 may be placed on, e.g. directly on, the insulating pattern 120 on the second element separation film 110_2.

The bit line structures 135_1 and 135_2 may extend long along the third direction DR3 across the active region ACT and the word line WL. For example, the bit line structures 135_1 and 135_2 may diagonally cross the active region ACT and vertically across the word line WL. A plurality of bit line structures 135_1 and 135_2 may extend to be parallel with each other. Also, the bit line structures 135_1 and 135_2 may be spaced apart from each other at equal intervals.

The bit line structures 135_1 and 135_2 may include a bit line 130 placed on the substrate 100 and a capping pattern 134 placed on the bit line 130.

The first bit line 130_1 placed on a bit line contact 136 to be described later may include a second conductive film 132 and a third conductive film 133 which are sequentially stacked. The second bit line 130_2 placed on the insulating pattern 120 may include a first conductive film 131, a second conductive film 132 and a third conductive film 133 which are sequentially stacked. However, example embodiments are not limited thereto. For example, the bit line 130 may be, include, or consist of a single film.

Each of the first conductive film 131, the second conductive film 132 and the third conductive film 133 may include, for example, polysilicon such as doped polysilicon, TiN, TiSiN, tungsten, tungsten silicide or a combination thereof. For example, the first conductive film 131 may include polysilicon such as doped polysilicon, the second conductive film 132 may include TiSiN, and the third conductive film 133 may include tungsten. However, the example embodiments are not limited thereto.

The capping pattern 134 may be placed on the bit line 130. For example, the capping pattern 134 may be placed on, e.g. directly on, the third conductive film 133. Although the capping pattern 134 may be or include silicon nitride, and may be formed with a CVD process, example embodiments are not limited thereto.

The bit line contact 136 may be placed between the first element separation films 110_1 adjacent to each other. The first bit line structure 135_1 may be placed on the active region ACT between the first element separation films 110_1 adjacent to each other. The first bit line structure 135_1 may be placed on the bit line contact 136 and may be electrically connected, e.g. directly connected, to the active region ACT through the bit line contact 136.

The bit line contact 136 may penetrate the insulating pattern 120 in a fourth direction DR4 to connect the active region ACT of the substrate 100 to the bit line structures 153_1 and 135_2. For example, the substrate 100 may include a first trench 136t formed inside/within the active region ACT and the element separation film 110. The first trench 136t may penetrate the insulating pattern 120 to expose a part of the active region ACT. The bit line contact 136 may be formed in/within the first trench 136t to connect the active region ACT of the substrate 100 and the bit line 130. The bit line contact 136 may be or correspond to the direct contact DC of FIG. 1.

In some example embodiments, as shown in FIG. 2, the first trench 136t may expose the center of the active region ACT. Accordingly, the bit line contact 136 may be connected to the center of the active region ACT. A part of the first trench 136t may overlap a part of the element separation film 110. As a result, the first trench 136t may expose not only a part of the substrate 100 but also a part of the element separation film 110.

The bit line contact 136 may include a conductive material. The bit line 130 of the bit line structures 135_1 and 135_2 may be electrically connected, e.g. directly connected, to the active region ACT of the substrate 100. The active region ACT of the substrate 100 connected to the bit line contact 136 may function as a source and drain region.

In some example embodiments, the bit line contact 136 may be or include the same, e.g. exactly the same, material as the first conductive film 131, and/or may be formed at the same time. For example, the bit line contact 136 may include polysilicon such as doped polysilicon. However, example embodiments are not limited thereto, and the bit line contact 136 may include a material different from the first conductive film 131 according to the fabricating process.

A spacer structure 150 may extend along the side walls of the bit line structures 135_1 and 135_2. For example, the spacer structure 150 may extend in the third direction DR3.

In some example embodiments, a part/portion of the spacer structure 150 may be placed inside the first trench 136t. For example, as shown in FIG. 2, the lower part of the spacer structure 150 may extend along the side walls of the bit line contact 136. The lower part of the bit line contact 136 may fill a part of the first trench 136t, and the lower part of the spacer structure 150 may fill the other part of the first trench 136t. In the region of the bit line structures 135_1 and 135_2 in which the bit line contact 136 is not placed, the spacer structure 150 may be placed on the insulating pattern 120.

The spacer structure 150 may be or include multi-films including a combination of a plurality of types of insulating materials. As shown in FIG. 2, the spacer structure 150 may include, for example, first to fourth spacers 151, 153, 154 and 155. For example, the first to fourth spacers 151, 153, 154 and 155 may include one of a silicon oxide film, a silicon nitride film, a silicon oxynitride film (SiON), a silicon oxycarbonitride film (SiOCN), air such as clean, dry air, and combinations thereof, and may be formed with a conformal deposition process such as a CVD process. However, example embodiments are not limited thereto.

A second trench 140t may be placed on at least one side of the bit line structures 135_1 and 135_2. The second trench 140*t* may be placed between the first bit line structure 135_1 and the second bit line structure 135_2 which are adjacent to each other.

The second trench 140*t* may be formed to extend to the interior of the substrate 100. The second trench 140*t* may penetrate the insulating pattern 120 in the fourth direction DR4 to expose a part of the element separation film 110 and a part of the active region ACT of the substrate 100.

Additionally or alternatively, the second trench 140*t* may expose a part of the lower face of the insulating pattern 120. The second trench 140*t* may expose the lower face of the insulating pattern 120 that does not overlap the second element separation film 110_2 in the fourth direction DR4.

The second trench 140*t* may include a first portion 140*t*_1 formed in the element separation film 110, and a second portion 140*t*_2 formed in the substrate 100. The first portion 140*t*_1 of the second trench 140*t* may be placed on, e.g. directly on, the first element separation film 110_1, and the second portion 140*t*_2 of the second trench 140*t* may be placed on, e.g. directly on, the substrate 100 between the first element separation film 110_1 and the second element separation film 110_2 which are adjacent to each other. For example, the first portion 140*t*_1 of the second trench 140*t* may mean or correspond to a portion which overlaps the element separation film 110 in the fourth direction DR4, and the second portion 140*t*_2 of the second trench 140*t* may mean or correspond to a portion which overlaps the substrate 100 in the fourth direction DR4.

The lower face of the second trench 140*t* may have a step. For example, a bottom face 140*t*_1_*b* of the first portion 140*t*_1 may be placed above a bottom face 140*t*_2_*b* of the second portion 140*t*_2. However, example embodiments are not limited thereto. For example, in some embodiments, the bottom face 140*t*_1_*b* of the first portion 140*t*_1 may be formed on the same plane as, or lower than, the bottom face 140*t*_2_*b* of the second portion 140*t*_2.

The bottom face 140*t*_2_*b* of the second portion 140*t*_2 may be placed above the upper face 136*u* of the bit line contact 136.

Connecting side wall which connects the bottom face 140*t*_1_*b* of the first portion 140*t*_1 and the bottom face 140*t*_2_*b* of the second portion 140*t*_2 may be defined by a first element separation film 110_1 in which at least a part of the first bit line structure 135_1 is placed.

The storage contact 140 may be placed between the first bit line structure 135_1 and the second bit line structure 135_2. The storage contact 140 may be placed inside the second trench 140*t*. Here, the storage contact 140 may be or correspond to the buried contact BC of FIG. 1.

The storage contact 140 may be placed on the element separation film 110 and the active region ACT of the substrate 100. The storage contact 140 may overlap a part of the first element separation film 110_1 in the fourth direction DR4, and may overlap the active region ACT of the substrate 100 between the first element separation film 110_1 and the second element separation film 110_2 adjacent to each other in the fourth direction DR4. The active region ACT of the substrate 100 being in contact with (e.g. direct contact with) the storage contact 140 may function as the source and drain region.

The storage contact 140 may be spaced apart from the bit line contact 136 and the bit line 130. The storage contact 140 may be electrically insulated from the bit line contact 136 and the bit line 130 by the insulating pattern 120 and the spacer structure 150.

An upper face 140*u* of the storage contact 140 may be placed above an upper face 136_*u* of the bit line contact 136.

The storage contact 140 may be or include a conductive material. Although the storage contact 140 may be, include, or consist of, for example, doped or undoped single crystal silicon, example embodiments are not limited thereto. Also, the storage contact 140 may have the same crystal orientation, e.g. may have the same Miller index, as the active region ACT of the substrate 100. Hereinafter, a detailed explanation will be given referring to FIGS. 4 to 12.

The storage pad 160 may be placed on the storage contact 140. The storage pad 160 may be electrically connected, e.g. directly connected, to the storage contact 140. Here, the storage pad 160 may be or correspond to the landing pad LP of FIG. 1.

The storage pad 160 may overlap a part of the upper faces of the bit line structures 135_1 and 135_2 or may not overlap the upper faces of the bit line structures 135_1 and 135_2.

The storage pad 160 may include, for example, at least one of an impurity-doped semiconductor material such as doped polysilicon, a conductive silicide compound, a conductive metal nitride, and a metal. The storage pad 160 may be formed with a CVD process and/or a physical vapor deposition (PVD) process; however, example embodiments are not limited thereto.

The interlayer insulating film 180 may be placed on the storage pad 160 and the bit line structures 135_1 and 135_2. Further, the interlayer insulating film 180 may fill the third trench 180*t*. Accordingly, the plurality of storage pads 160 may be separated from each other by the bit line structures 135_1 and 135_2 and the interlayer insulating film 180. In some example embodiments, the upper face of the interlayer insulating film 180 may be formed to be higher than the upper face of the storage pad 160. Alternatively or additionally, the interlayer insulating film 180 may expose at least a part of the upper face of the storage pad 160.

The interlayer insulating film 180 may be or include an insulating material. Although the interlayer insulating film 180 may include, for example, a silicon oxide film, a silicon nitride film, a silicon oxynitride film and a combination thereof, example embodiments are not limited thereto.

The information storage element 170 may be placed on the interlayer insulating film 180 and the storage pad 160. The information storage element 170 may be connected to a part of the upper face of the storage pad 160 exposed by the interlayer insulating film 180. As a result, the information storage element 170 may be electrically connected (e.g. directly connected) to the source and drain region formed in the active region ACT of the substrate 100 through the storage pad 160 and the storage contact 140.

The information storage element 170 may include, for example, but is not limited to, capacitors such as metal-insulator-metal capacitors. The information storage element 170 includes a bottom cell plate/lower electrode 171, a capacitor insulating film 172, and a top cell plate/an upper electrode 173.

The lower electrode 171 may have, for example, a cylinder shape or a tapered cylindrical shape. More specifically, the lower electrode 171 may include side wall parts 171*s* extending in a thickness direction of the substrate 100, and a bottom part 171*b* parallel to the upper face of the substrate 100. The bottom part 171*b* of the lower electrode may connect the side wall parts 171*s* of the lower electrode.

For example, the information storage element 170 may include a lower electrode 171, a capacitor insulating film 172 and an upper electrode 173. The capacitor insulating film 172 may be interposed between the lower electrode 171 and the upper electrode 173. The information storage element 170 may store electric charges in the capacitor insulating film 172, using a potential difference occurring between the lower electrode 171 and the upper electrode 173.

The capacitor insulating film 192 is formed on the lower electrode 191. The capacitor insulating film 192 may be formed along the profile of the lower electrode 191. The capacitor insulating film 192 may be formed along an outer wall and an inner wall of the lower electrode 191.

The upper electrode 173 is formed on the capacitor insulating film 172. The upper electrode 173 may wrap the outer wall of the lower electrode 171. Further, a part of the upper electrode 173 may be interposed between the side wall parts 171s of the lower electrode.

The lower electrode 171 may include, for example, but is not limited to, a doped semiconductor material, a conductive metal nitride (e.g., at least one of titanium nitride, tantalum nitride, tungsten nitride, etc.), a metal (e.g., ruthenium, iridium, titanium, tantalum, etc.), and conductive metal oxides (e.g., iridium oxide, etc.) and/or the like.

The capacitor insulating film 172 may include, for example, but is not limited to, one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combination thereof. The capacitor insulating film 192 may be or include a material having a high dielectric constant. The capacitor insulating film 192 may include other materials that increase the dielectric constant of the capacitor insulating film 192; however, example embodiments are not limited thereto.

The upper electrode 173 may include, for example, at least one of a doped semiconductor material, a metal, a conductive metal nitride, and a metal silicide.

Figure 3:
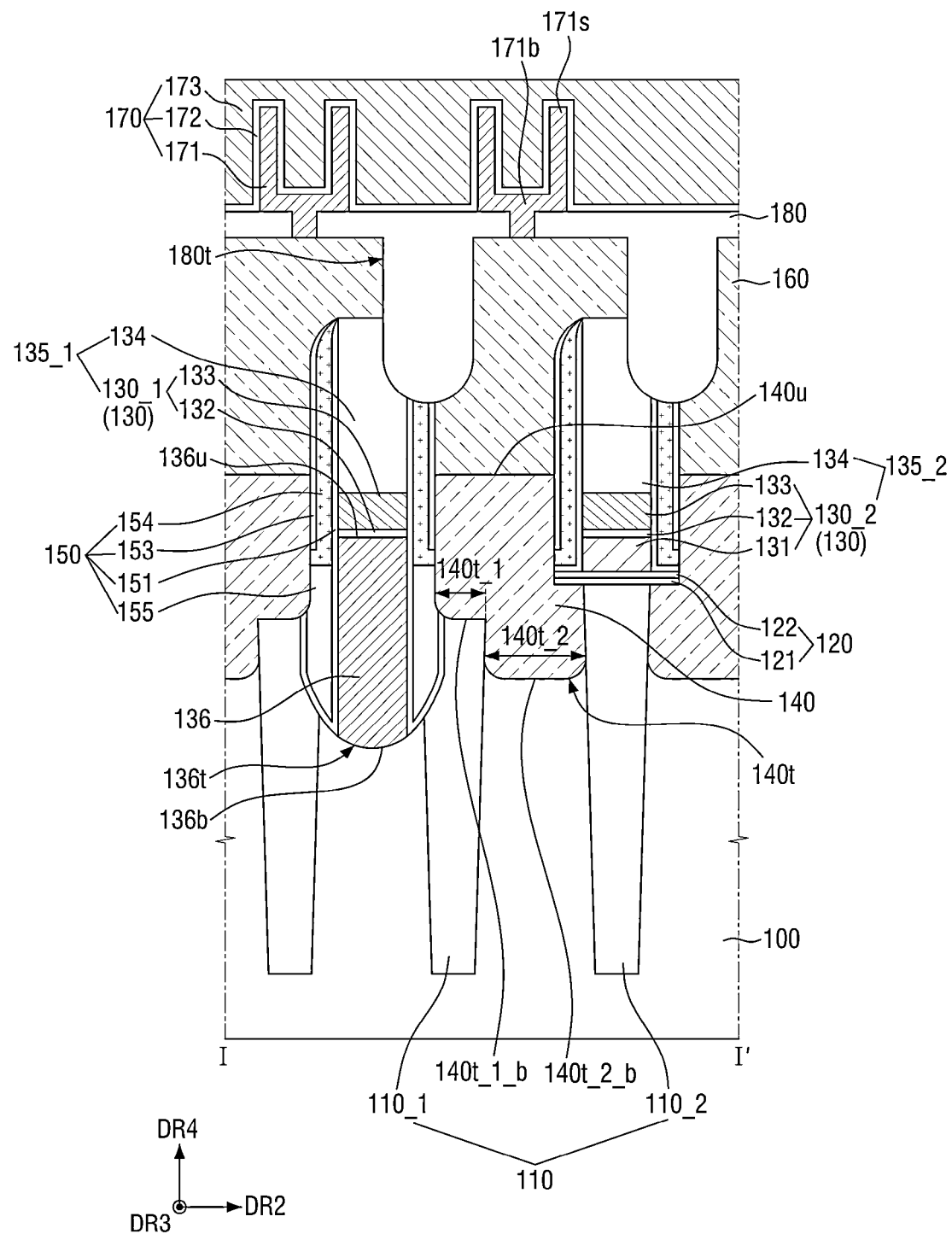
FIG. 3 is a diagram for explaining a semiconductor device according to some example embodiments.

FIG. 3 is a diagram for explaining a semiconductor device according to some other embodiments. For convenience of explanation, points different from contents explained using FIGS. 1 and 2 will be mainly explained.

Referring to FIG. 3, in the semiconductor devices according to some other embodiments, the lower electrode 171 may have a wineglass shape and/or a pillar shape that extends long in the thickness direction of the substrate 100. For example, the lower electrode 171 may extend long in the fourth direction DR4.

The capacitor insulating film 172 may be formed, e.g. formed conformally, along the outer wall of the lower electrode 171. The upper electrode 173 wraps around the lower electrode 171, but is not interposed to the interior of the lower electrode 171.

FIGS. 4 to 12 are intermediate stage diagrams for explaining a method for fabricating the semiconductor device according to some example embodiments. For reference, FIGS. 3 to 12 are intermediate stage diagrams taken along a line I-I' of FIG. 1.

Figure 4:
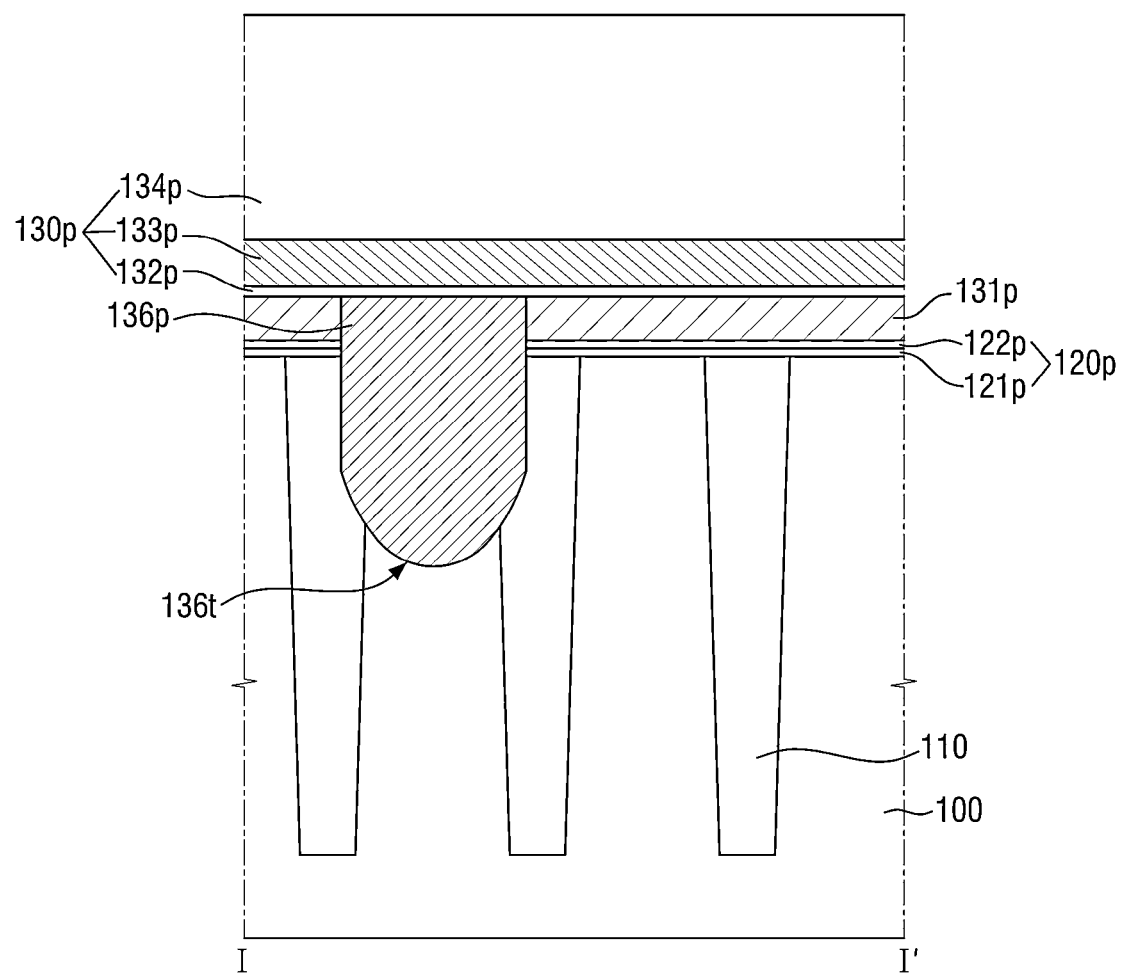
FIGS. 4 to 12 are intermediate stage diagrams for explaining a method for fabricating a semiconductor device according to some example embodiments.

Referring to FIG. 4, an element separation film 110 is formed in the substrate 100, e.g. the substrate 100 is etched and filled with the element separation film 110, and the active region (ACT of FIG. 1) may be defined by the element separation film 110. A plurality of word lines (WL of FIG. 1) extending in the second direction DR2 and spaced apart from each other in the third direction DR3 may be formed on the substrate 100.

Subsequently, a pre cell insulating film 120p may be formed on the substrate 100 and the element separation film 110. The pre cell insulating film 120p may be or include, but is not limited to, a first pre cell insulating film 121p and a second pre cell insulating film 122p.

Subsequently, in the region in which the bit line contact 136 is formed, the first pre conductive film 131p and the pre cell insulating film 120p may be removed to form the first trench 136t. A pre bit line contact 136p that fills the first trench 136t may be formed, e.g. formed with a CVD process and/or a planarization process such as a chemical mechanical planarization (CMP) process and/or an etch back process.

A second pre conductive film 132p and a third pre conductive film 133p may be sequentially formed on the pre bit line contact 136p and the first pre conductive film 131p. As a result, the pre wiring conductive film 130p including the first to third pre conductive films 131p, 132p and 133p may be formed on the pre cell insulating film 120p.

Subsequently, a pre wiring capping pattern 134p may be formed on the pre wiring conductive film 130p, e.g. formed with a CVD process and/or a planarization process such as a chemical mechanical planarization (CMP) process and/or an etch back process.

Figure 5:
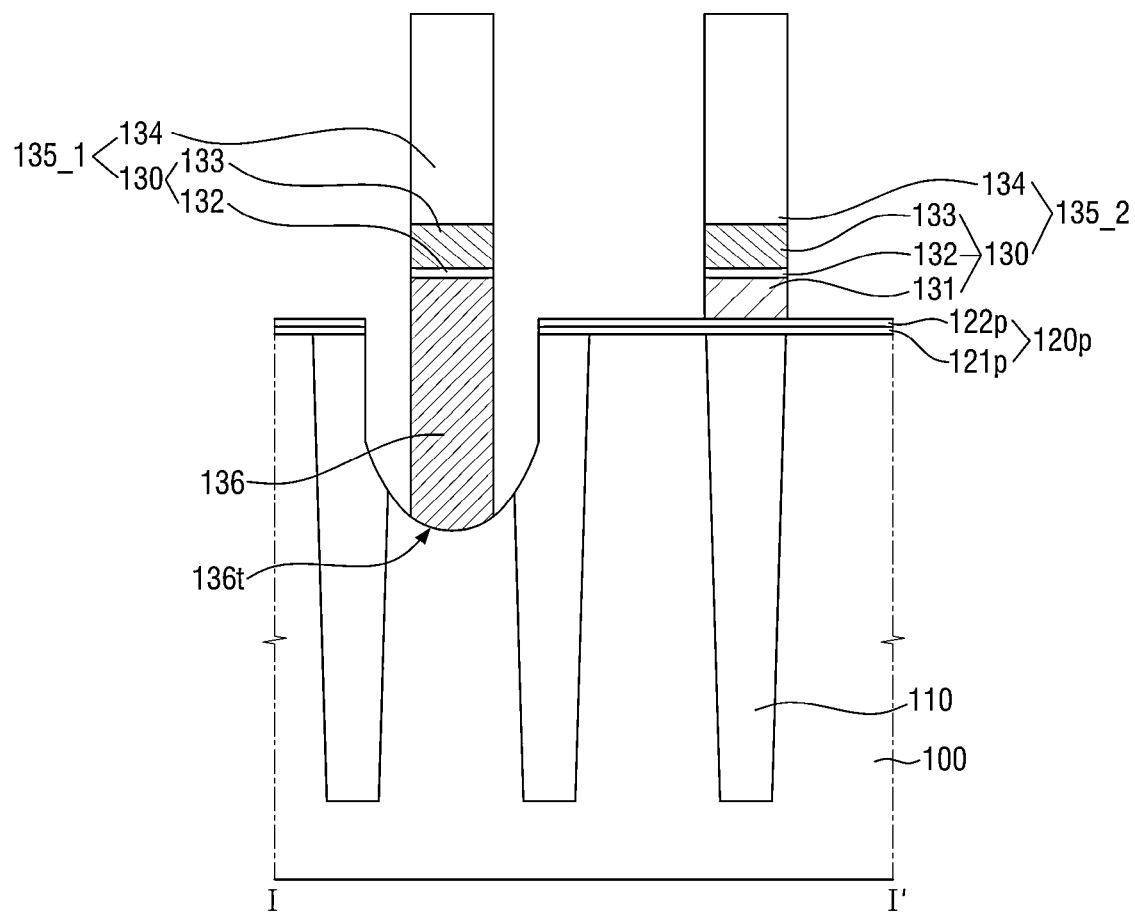
Figure 5:
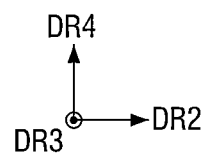

Referring to FIG. 5, a plurality of bit lines 130 and a capping pattern 134 extending in the third direction DR3 on the substrate 100 and the pre cell insulating film 120p are formed, by patterning (e.g. patterning with a photolithographic process and etching with an anisotropic etching process) the pre wiring conductive film 130p and the pre wiring capping pattern 134p.

For example, bit line structures 135_1 and 135_2 extending in the third direction DR3 may be formed on the substrate 100 and the pre cell insulating film 120p.

Further, the bit line contact 136 may be formed between the bit line 130 and the substrate 100, by patterning the pre bit line contact 146p formed inside the first trench 136t.

Figure 6:
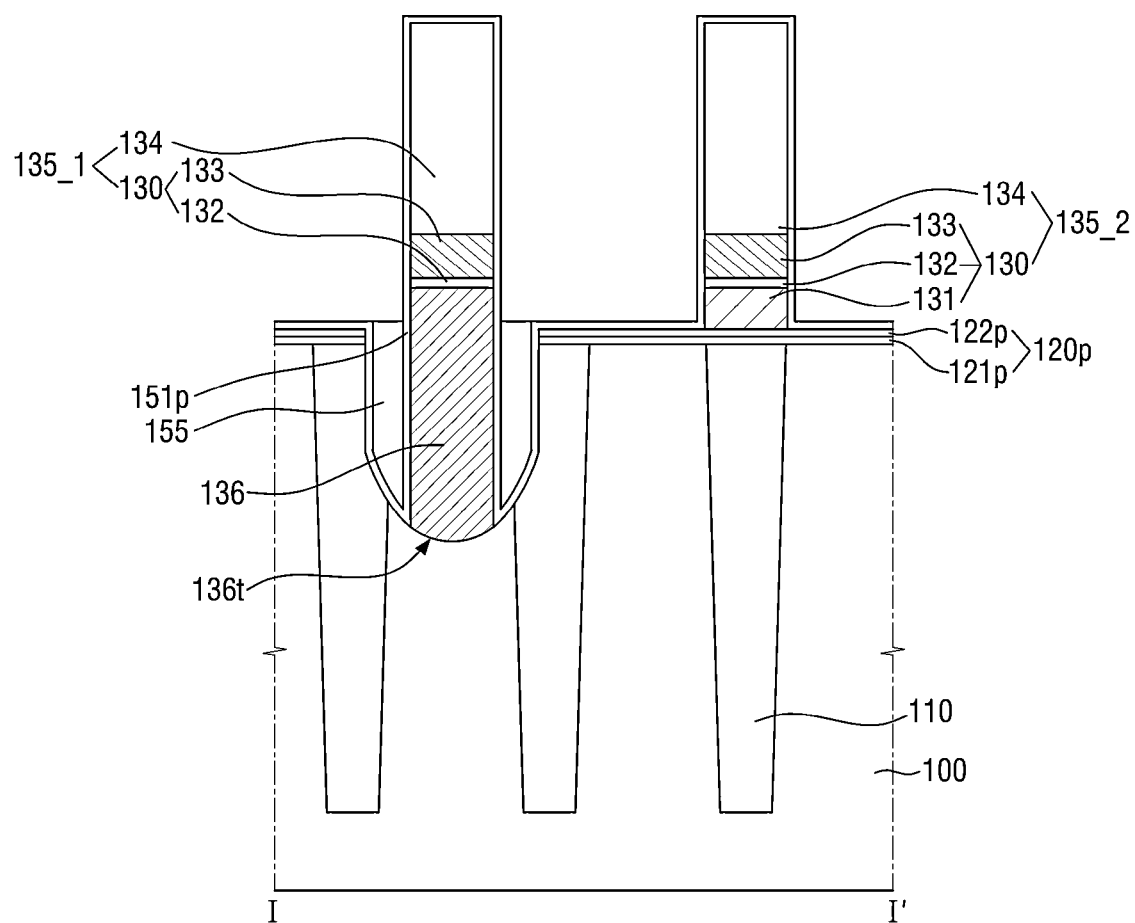

Referring to FIG. 6, the first pre spacer film 151p may be formed on the upper face of the second pre insulating film 122p, the side walls of the first trench 136t, the side walls of the bit line contact 136, and the side walls and the upper faces of the bit line structures 135_1 and 135_2. The first pre spacer film 151p may be formed in a conformal manner.

Subsequently, a fourth spacer 155 may be formed to fill the interior of the first trench 136t. Accordingly, the upper face of the fourth spacer 155 may be formed on the same plane as the upper face of the first pre spacer film 151p formed on the upper face of the second pre insulating film 122p. However, example embodiments are not limited thereto.

Figure 7:
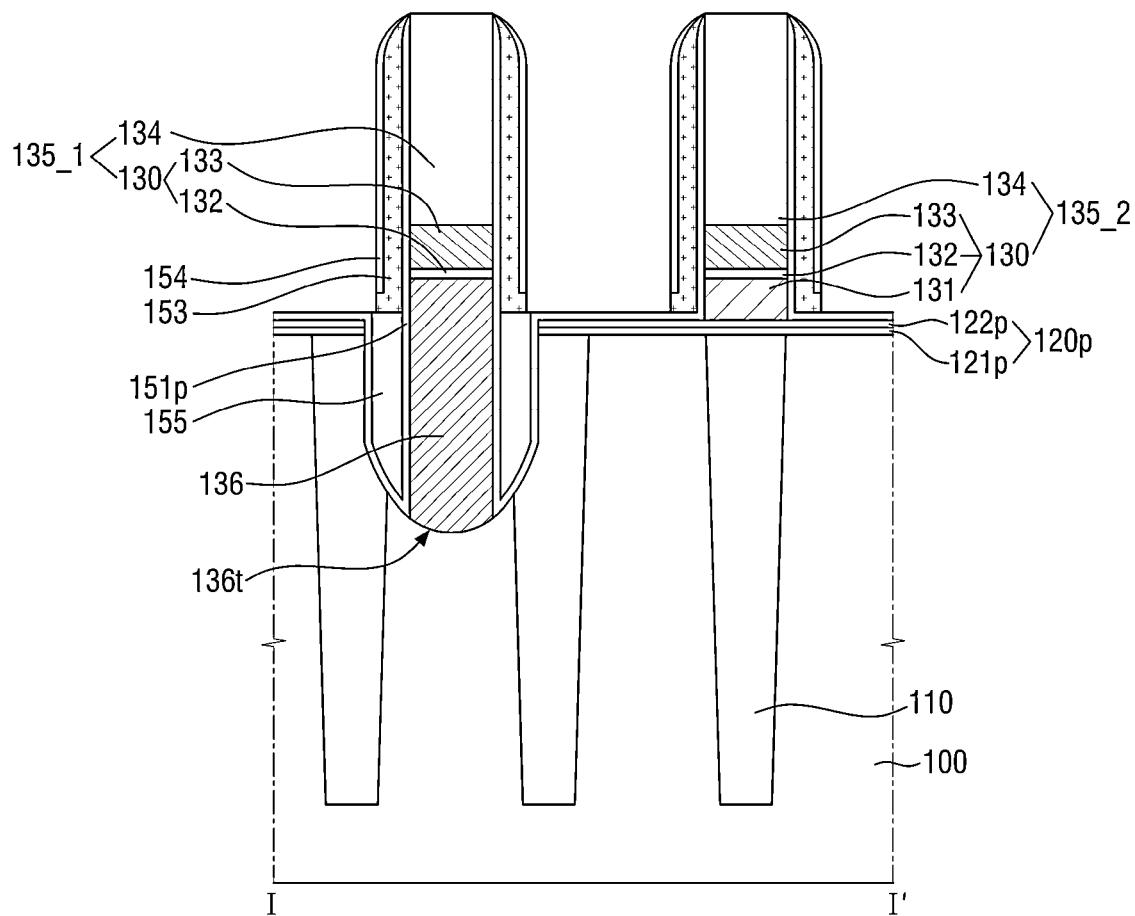

Referring now to FIG. 7, a second spacer 153 and a third spacer 154 may be formed along the side walls of the bit line contact 136 and the side walls of the bit line structures 135_1 and 135_2.

The second spacer 153 and the third spacer 154 may be sequentially stacked on the first pre spacer film 151p. In the region in which the bit line contact 136 is formed, the second spacer 153 and the third spacer 154 may be formed to overlap the fourth spacer 155 in the fourth direction DR4. As a result, the spacer structure 150 may be formed.

Figure 8:
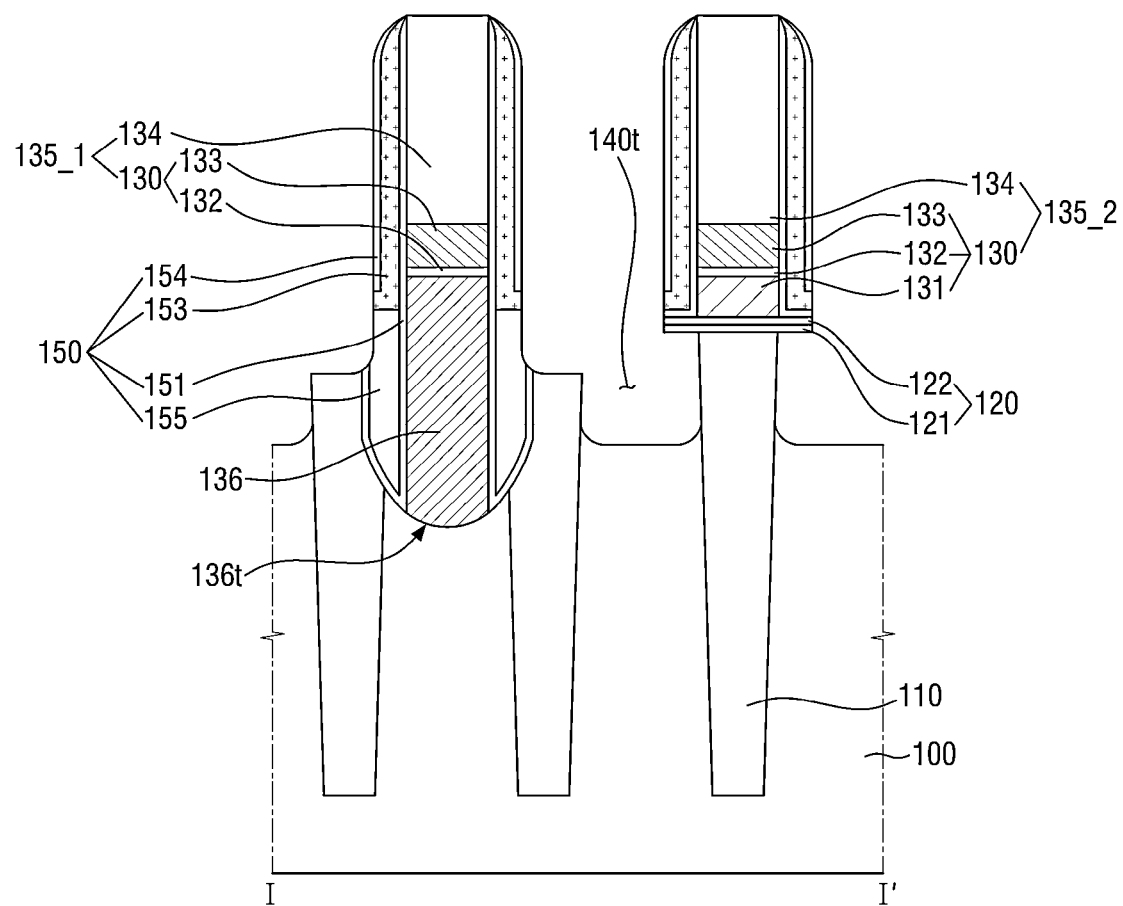

Referring to FIG. 8, a second trench 140t may be formed in the substrate 100.

The second trench 140t may be formed to penetrate the first pre insulating film 121p and the second pre insulating film 122p. The second trench 140t may expose a part of the side walls of the fourth spacer 155, a part of the element separation film 110, and a part of the active region ACT of the substrate 100. Further, the second trench 140t may expose a part of the lower face of the insulating pattern 120. The second trench 140t may be formed with an etch process such as a wet etch process and/or a dry etch process, and may be formed by using a chemical and/or chemicals, such as potassium hydroxide (KOH), that etches single-crystal silicon faster or at a higher rate than silicon oxide.

Figure 9:
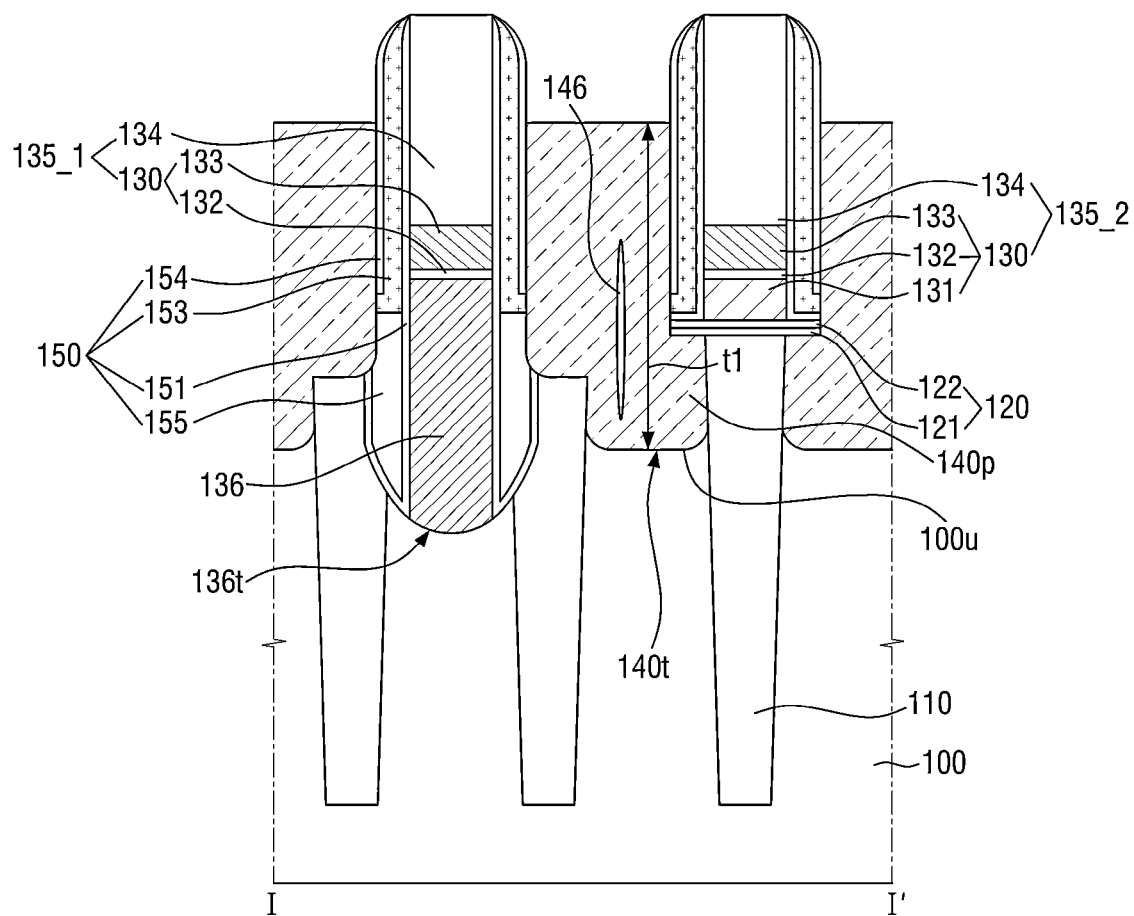
Figure 9:
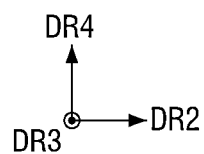

Referring to FIG. 9, a pre storage contact 140*p* may be formed in the second trench 140*t*. The pre storage contact 140*p* may have a first thickness t1 from the upper face 100*u* of the substrate 100.

The pre storage contacts 140*p* may be or include, for example, polysilicon. The polysilicon may be deposited with a CVD process; however, example embodiments are not limited thereto. The pre storage contact 140*p* may be doped with impurities such as phosphorus (P) and/or arsenic (As) and/or carbon (C). The pre storage contacts 140*p* may be doped in-situ with deposition of polysilicon and/or with an implantation process such as an ion implantation process; however, example embodiments are not limited thereto. The pre storage contacts 140*p* may or may not be formed with an epitaxial process such as a homogenous epitaxial silicon deposition process that uses the second trench 140*t* as a seed layer. There may be no epitaxial layer formed on the second trench 140*t*, and polysilicon may be directly deposited on the second trench 140*t*.

The pre storage contact 140*p* may include a defect 146 such as a seam or a void. The defect 146 may include air and/or moisture; however, example embodiments are not limited thereto.

Figure 10:
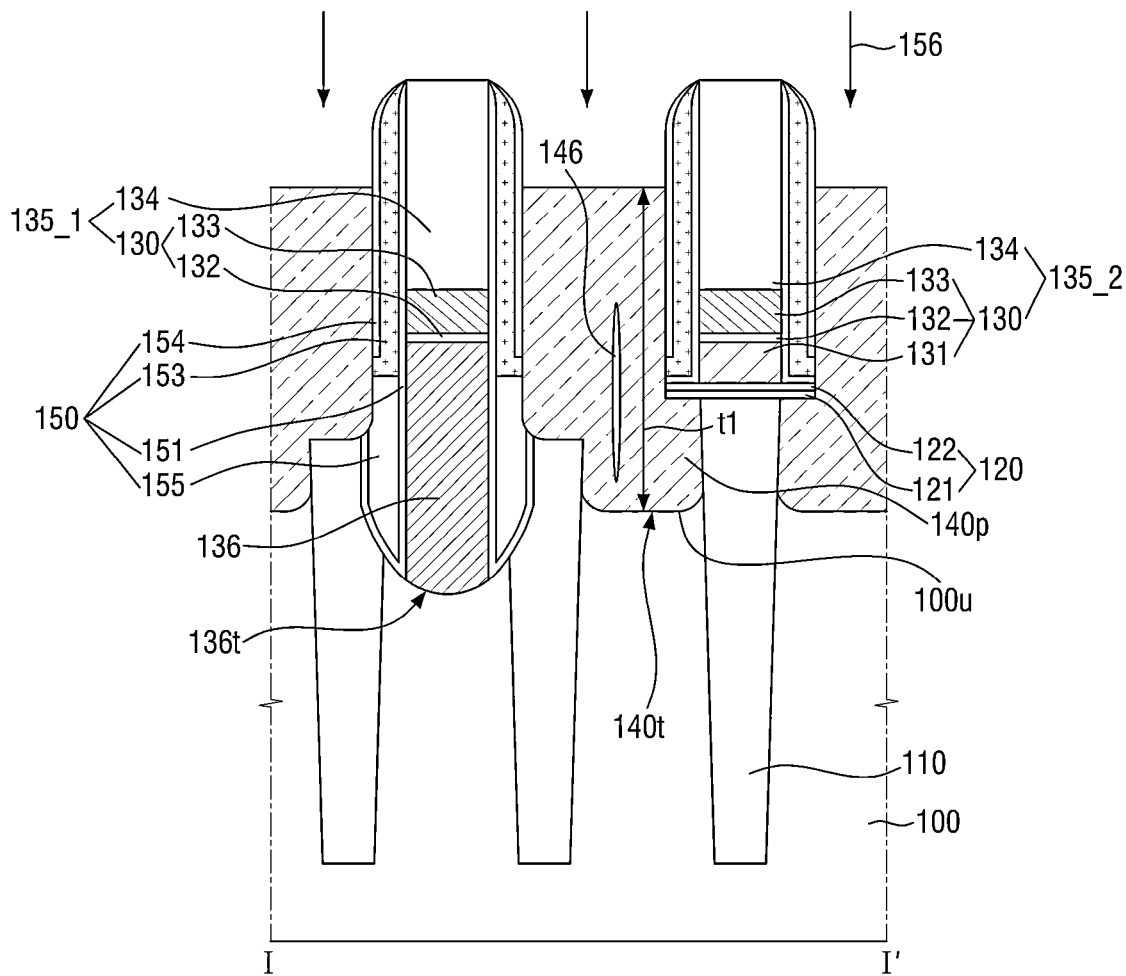

Referring to FIG. 10, the pre storage contact 140*p* may be irradiated. For example, a laser 156 may be irradiated onto the pre storage contact 140*p*. The laser 156 may be selectively absorbed only by the pre storage contact 140*p*. The laser 156 may have wavelengths that are absorbed by the pre storage contact 140*p* but are not absorbed by the peripheral regions. Thus, the peripheral regions may not be, or may be only insignificantly, affected by the irradiation of the laser 156.

For example, in the method for fabricating the semiconductor device according to some example embodiments, the laser 156 may have a wavelength equal to or higher than a wavelength corresponding to the band gap of the material constituting the pre storage contact 140*p*. Further, the laser 156 may have a wavelength of 1136.7 nm or less so as not to be or to be substantially absorbed by a silicon nitride film, a silicon oxide film, or the like other than the pre storage contact 140*p*.

For example, when the pre storage contact 140*p* includes polysilicon, the wavelength of the laser 156 may be 254.6 nm or more and 1136.7 nm or less. The laser 156 may be or be based on, for example, Yb:YAG (Ytterbium:Yttrium-Aluminum-Garnet) (X=511 nm) and/or Nd:YAG (Neodymium:Yttrium-Aluminum-Garnet) (X=532 nm).

The pre storage contacts 140*p* irradiated with the laser 156 may be rapidly quenched/rapidly cooled down after being melted so as to become a single crystallization/be recrystallized. As a result, the storage contact 140 including single crystal silicon may be formed. The storage contact 140 may have the same crystal orientation, e.g. the same Miller index, as the active region ACT of the substrate 100. The storage contact 140 may have the same crystal orientation due to the rapid quenching/rapid cool down.

Here, the single crystal may mean or correspond to a state in which there is substantially no grain boundary and/or seem, and the orientation of the crystal, e.g. the crystal within the active region ACT and the crystal within the storage contact 140, is constant. The single crystal means or corresponds to the layer or portion is substantially virtually a single crystal, even though there is or may be locally a grain boundary or a portion with different orientations. As an example, a layer that is substantially a single crystal may include a large number of low angle grain boundaries.

Additionally or alternatively, the defect 146 in the pre storage contact 140*p* may be removed.

The semiconductor device is highly integrated, and at the same time, the size of semiconductor device also decreases. As a result, the size of the storage contact 140 decreases and an aspect ratio increases.

The storage contact 140 may be formed, using polysilicon due to the ease of the process or the like. At this time, the defect 146 such as a seam or a void may be formed in polysilicon due to the high aspect ratio of the storage contact 140. Additionally or alternatively, the defect 146 may be formed in polysilicon by a region in which the second bit line structure 135_2 and the active region ACT of the substrate 100 intersect in the fourth direction DR4.

Such a defect 146 may become severe as the diameter of the storage contact 140 decreases and/or the concentration of doped silicon increases. As a result, the operational characteristics of the semiconductor device may be degraded.

However, in the semiconductor device according to some example embodiments, internal defect 146 of the storage contact 140 may be removed by laser irradiation. As a result, a contact area between the storage contact 140 and the information storage element 170 may increase, and/or an electrical resistance between the substrate 100 and the information storage element 170 may be reduced.

Alternatively or additionally, the storage contact 140 may include single crystal silicon. The storage contact 140 may have the same crystal orientation as the crystal orientation of the substrate 100. Thus, because there is no crystal boundary of the storage contact 140 or the crystal boundary of the storage contact 140 decreases, mobility of the dopant, such as boron and/or phosphorus and/or arsenic, may increase. Therefore, an operating time tRDL of the semiconductor device may be improved.

Figure 11:
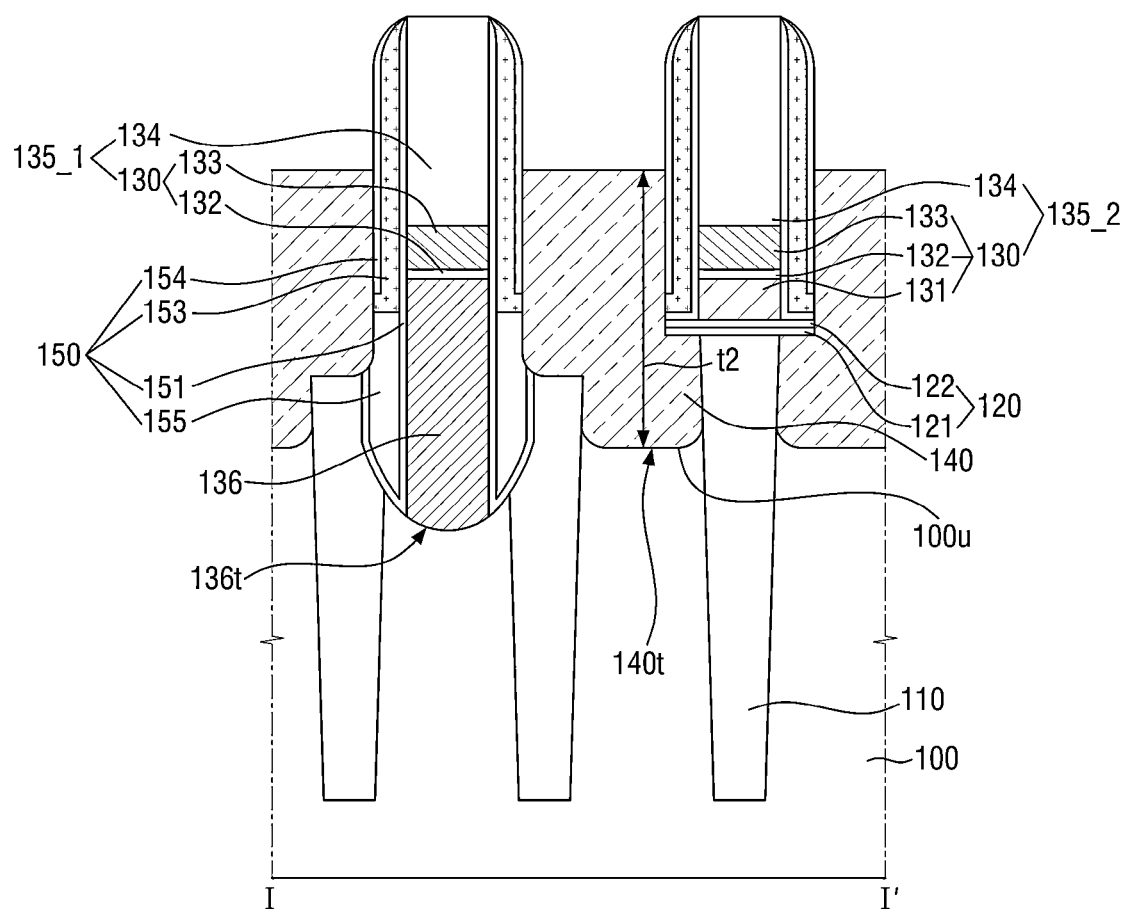

Referring to FIG. 11, the storage contact 140 may be formed. In the semiconductor device according to some example embodiments, the storage contact 140 may have a second thickness t2 from the upper face of the substrate 100. The second thickness t2 may be smaller than the first thickness t1. For example, the first thickness t1 may be about one-third larger than the second thickness t2.

Silicon included in the pre storage contact 140*p* may tend to liquefy/change phase and get, e.g. getter, together when irradiated with the laser 156. Thus, the lower part of the pre storage contact 140*p* may be detached.

However, when the pre storage contact 140*p* is formed with a first thickness t1 thicker than the second thickness t2 of the storage contact 140 to be formed, the upper part of the melted pre storage contact 140*p* having a higher temperature than the lower part of the pre storage contact 140*p* may move to the lower part. Therefore, detachment of the storage contact 140 may be improved or prevented or reduced in likelihood of occurrence.

Figure 12:
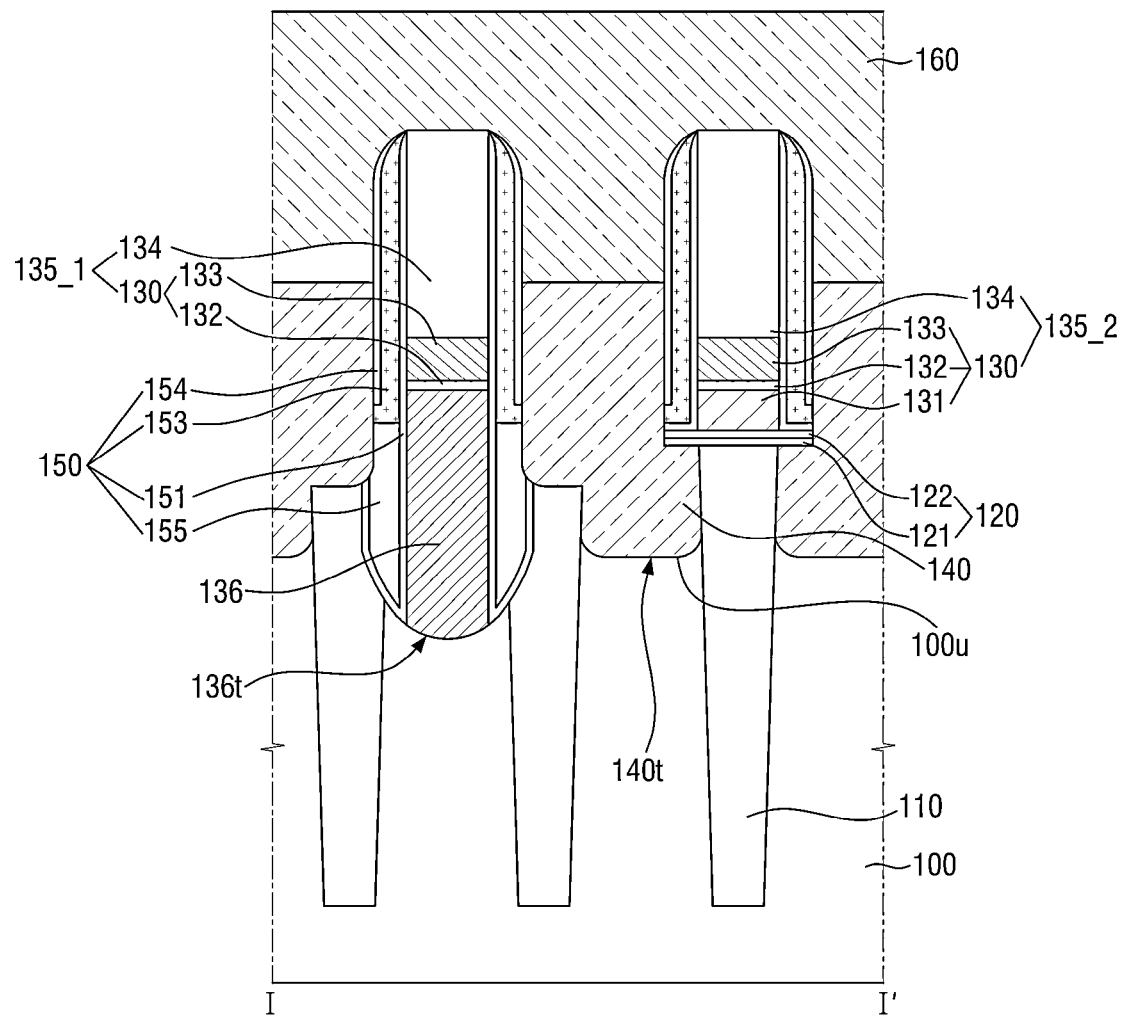

Referring to FIG. 12, a storage pad 160 may be formed. The storage pad 160 may be formed to cover the storage contact 140 and the capping pattern 134.

Subsequently, referring to FIG. 2, the storage pad 160 may be patterned to form a third trench 180*t*. The third trench 180*t* may be formed by etching a part of the bit line structures 135_1 and 135_2 and a part of the spacer structure 150.

Subsequently, an interlayer insulating film 180 may be formed on the upper face of the storage pad 160. Further, the interlayer insulating film 180 may be formed to fill the third trench 180t.

Subsequently, the interlayer insulating film 180 may be patterned to expose a part of the upper face of the storage pad 160.

Subsequently, an information storage element 170 may be formed on the interlayer insulating film 180. The information storage element 170 may be connected, e.g. directly connected, to the upper face of the storage pad 160 exposed on the interlayer insulating film 180.

Figure 13:
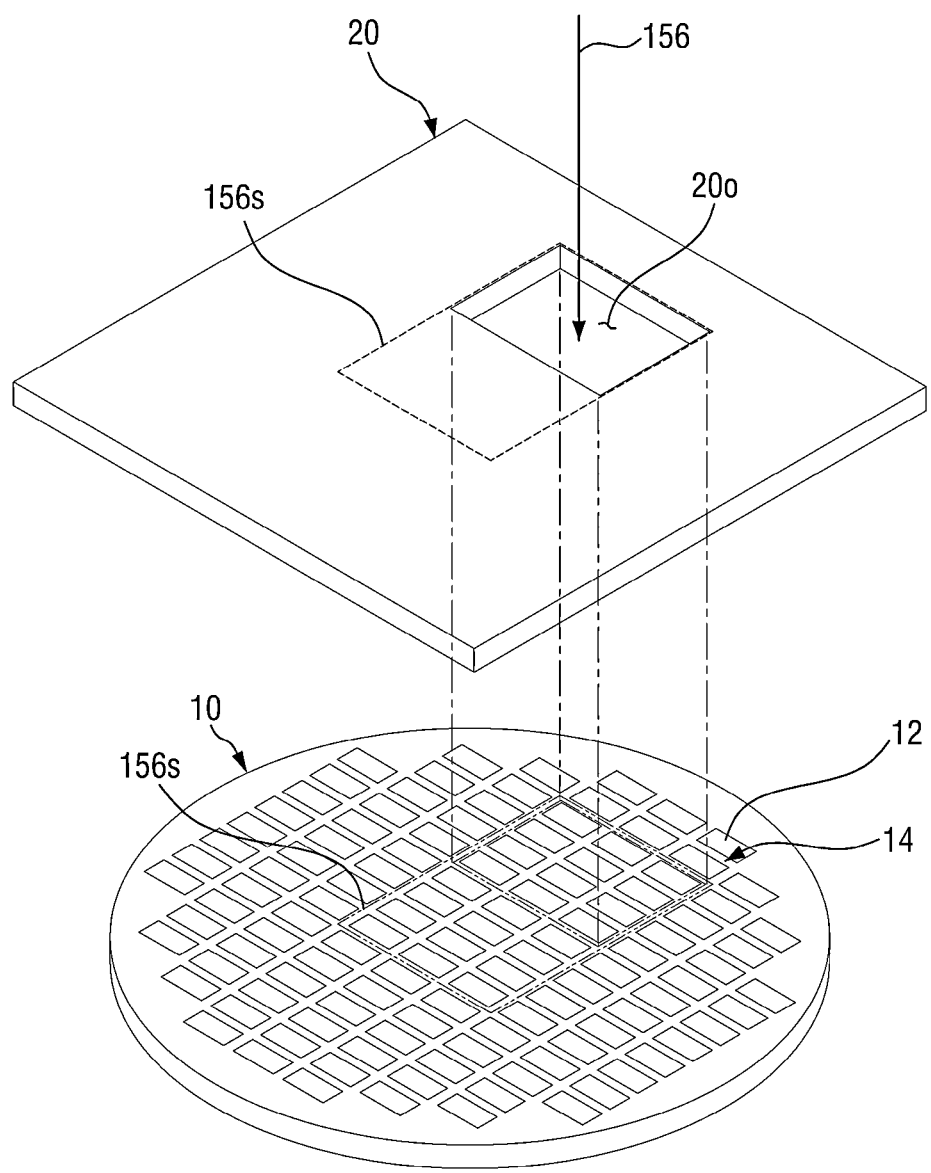
FIG. 13 is a diagram for explaining irradiation of laser to the semiconductor device according to some example embodiments.

FIG. 13 is a diagram for explaining irradiation of the laser to the semiconductor device according to some example embodiments. FIG. 13 is a diagram for explaining steps of FIG. 10.

Referring to FIG. 13, a wafer 10 may include a chip region 12 and a kerf region/scribe lane region 14. The wafer 10 may be or correspond to, for example, the substrate 100 shown in FIG. 10. The wafer 10 may have a diameter of 200 mm, or of 300 mm, or of 450 mm; however, example embodiments are not limited thereto.

A semiconductor chip may be formed in the chip region 12. The semiconductor device shown in FIG. 10 may be formed in the chip region 12.

The scribe lane region 14 may surround the chip region 12. For example, the scribe lane region 14 may be in the form of a straight lane having a constant width. Alternatively or additionally, a width of the scribe lane region 14 along a first direction may be different than a width of the scribe lane region 14 along a second direction perpendicular to the first direction. The chip regions 12 may be separated from each other by a die sawing process performed along the scribe lane region 14.

Referring to FIGS. 10 and 13, the laser 156 may be irradiated, e.g. irradiated in a shot manner. The laser 156 may be irradiated on a shot-by-shot basis. An area 156s of shot of the laser 156 may correspond to a part of the total area of the wafer 10.

The laser 156 may be irradiated to the semiconductor device, using a laser mask 20. The laser mask 20 may include an opening 20o that exposes at least a part of the wafer 10, for example at least several die within the chip regions 12. The laser 156 may be irradiated to the semiconductor device exposed by the opening 20o. The area of the opening 20o may be smaller than the area of the shot 156s. For example, the laser 156 may be irradiated onto a particular region or a particular chip smaller than/less than the area 156s of shot, using the laser mask 20.

Alternatively, the laser mask 20 may be irradiated to the entire area of the wafer 10 or an area wider than the area 156s of shot. After irradiating the wafer 10 with the first laser shot, the second laser shot may be irradiated using the laser mask 20. Edges of the first and second laser shots may overlap each other to use all the laser 156 shots and efficiently irradiate the laser 156. In this case, when the laser 156 is irradiated to overlap, a defect may occur in the semiconductor device.

However, in the method for fabricating the semiconductor device according to some example embodiments, the edge of the opening 20o of the laser mask 20 may be placed on the scribe lane region 14. Therefore, when the position of the laser mask 20 is moved and the laser 156 is irradiated to the wafer 10 exposed by the opening 20o, the laser 156 may not overlap the chip region 12. Therefore, the defect of the semiconductor device can be reduced in likelihood of occurrence.

Figure 14:
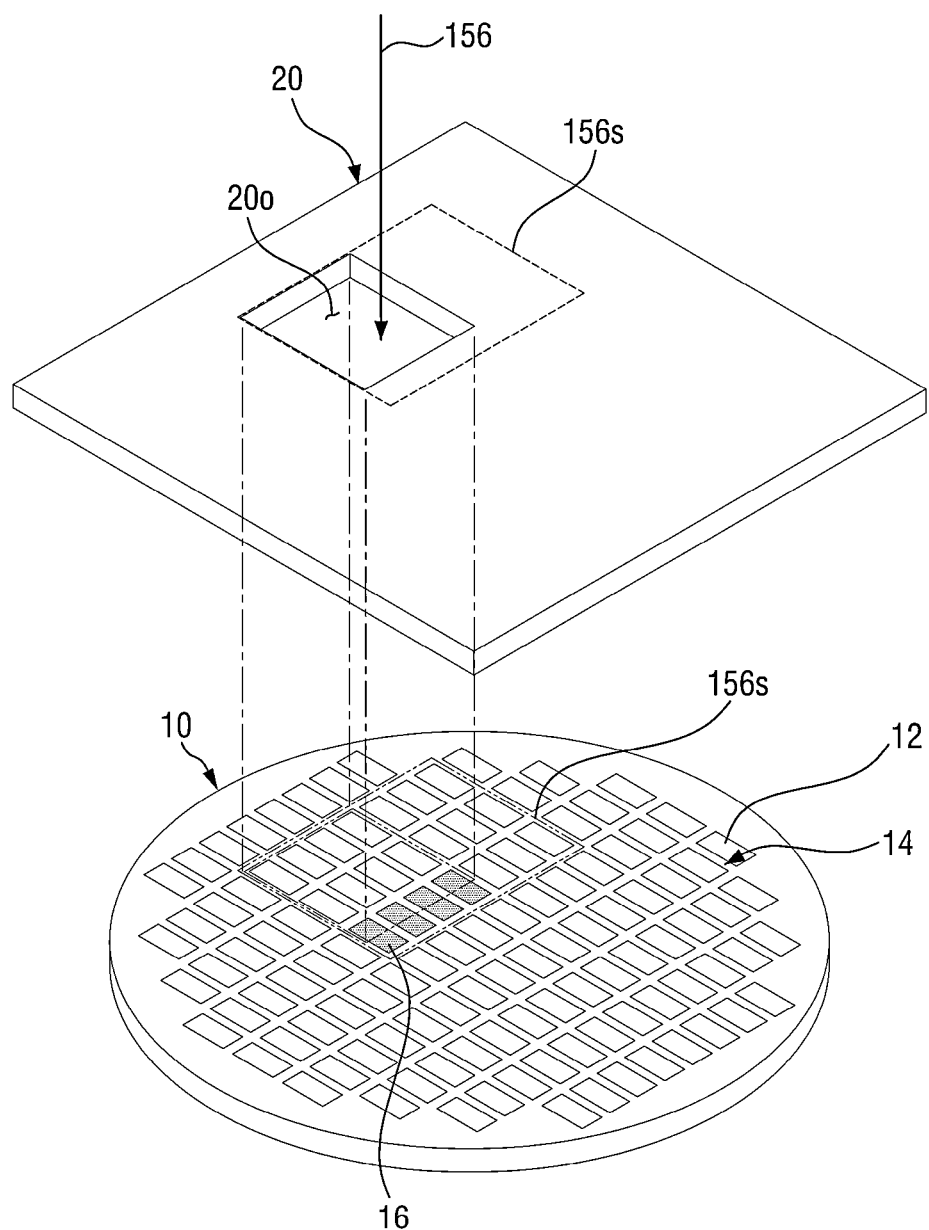
FIG. 14 is a diagram for explaining irradiation of laser to the semiconductor device according to some example embodiments.

FIG. 14 is a diagram for explaining irradiation of the laser to the semiconductor device according to some example embodiments. FIG. 14 is a diagram for explaining the steps of FIG. 10. For convenience of explanation, points different from contents explained referring to FIGS. 10 and 13 will be mainly explained.

Referring to FIG. 14, the wafer 10 may include a dummy region 16. The dummy region 16 may mean or correspond to a region which is not used as a cell and/or is not intended to be a final semiconductor device. The dummy region 16 may include, for example, a TEG (Test Element Group) region, an alignment key and the like.

The edge of the opening 20o of the laser mask 20 may be placed on the dummy region 16. Therefore, the laser may not overlap the chip region 12, and the defects of the semiconductor device can be reduced or improved.

Figure 15:
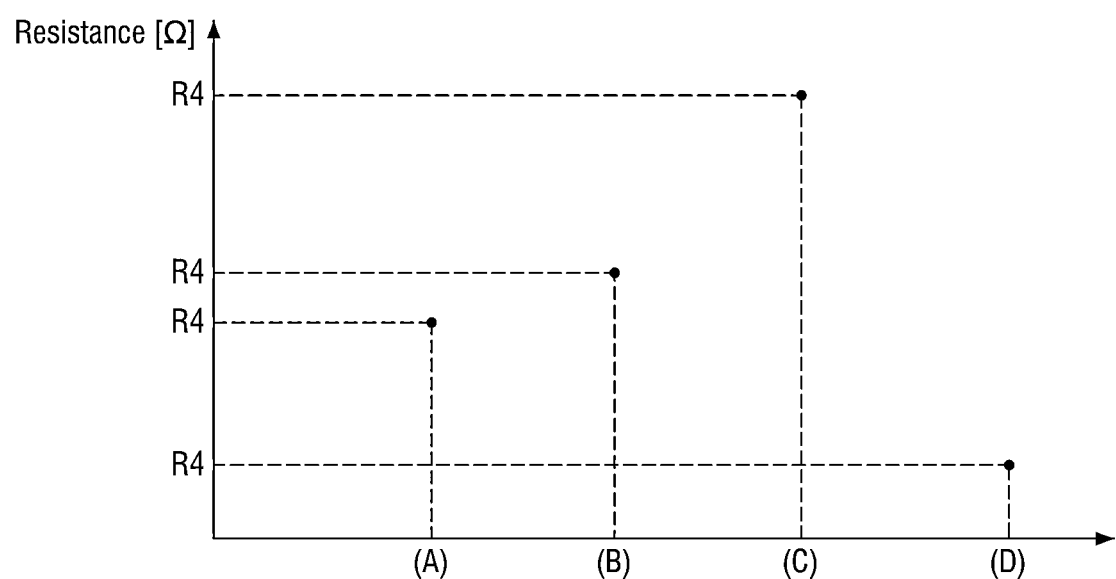
FIG. 15 is a graph for explaining resistance of the semiconductor device according to some example embodiments.

FIG. 15 is a graph for explaining the resistance of the semiconductor device according to some example embodiments.

In FIG. 15, (A), (B) and (C) of an X-axis represent the semiconductor devices having different design rules, and (D) represents a semiconductor devices having the same design rules as (C). (C) may have a design rule smaller than/more stringent than that of (B), and (B) may have a design rule smaller than/more stringent than that of (A). (C) and (D) have the same design rules, (C) is a semiconductor device including a storage contact which is not irradiated with a laser, and (D) may be a semiconductor device that includes a storage contact irradiated with a laser according to some example embodiments. In the semiconductor devices (A) to (D), the concentrations of the dopants injected into the storage contacts are all the same. A Y-axis represents resistance of the semiconductor device, e.g. in arbitrary units.

Referring to FIG. 15, a resistance R2 of the storage contact of the semiconductor device (B) is greater than a resistance R3 of the storage contact of the semiconductor device (C), and a resistance (R4) of the storage contact of the semiconductor device (D) is greater than the resistance R3 of the storage contact of the semiconductor device (C). For example, as the design rules decrease, the resistance of the storage contact of the semiconductor device increases.

In contrast, the resistance R1 of the storage contact of the semiconductor device (D) including the storage contact irradiated with a laser according to some example embodiments is smaller than/less than the resistance R4 of the storage contact of the semiconductor device (C) having the same design rules. Further, the resistance R1 of the storage contact of the semiconductor device (D) is smaller than the resistance R2 of the storage contact of the semiconductor device (A) having the largest design rule.

Therefore, according to some example embodiments, the resistance of the storage contact irradiated with a laser may be reduced. The reduction of the resistance of the storage contact may enable a more reliable and/or higher yielding semiconductor device.

FIGS. 16A-17B are graphs for explaining a concentration of dopant of the semiconductor device according to some example embodiments.

Figure 16A:
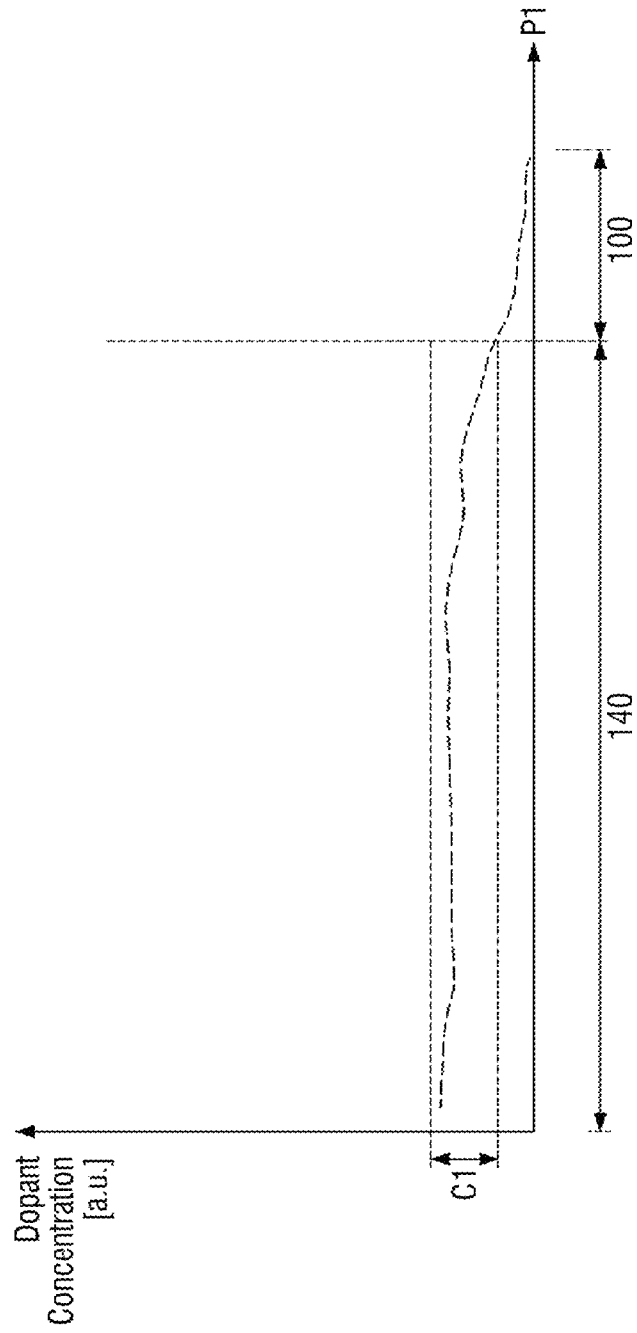
FIGS. 16A and 16B are graphs for explaining a concentration of a dopant of the semiconductor device according to some example embodiments.
Figure 16B:
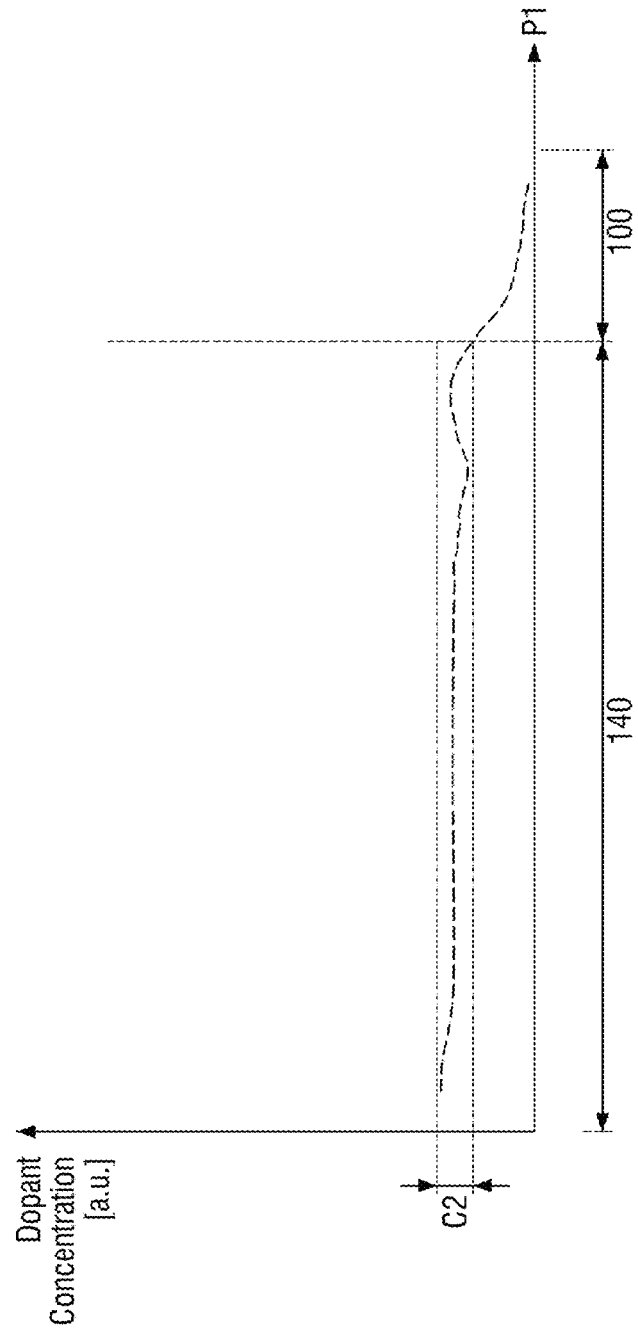
Figure 17A:
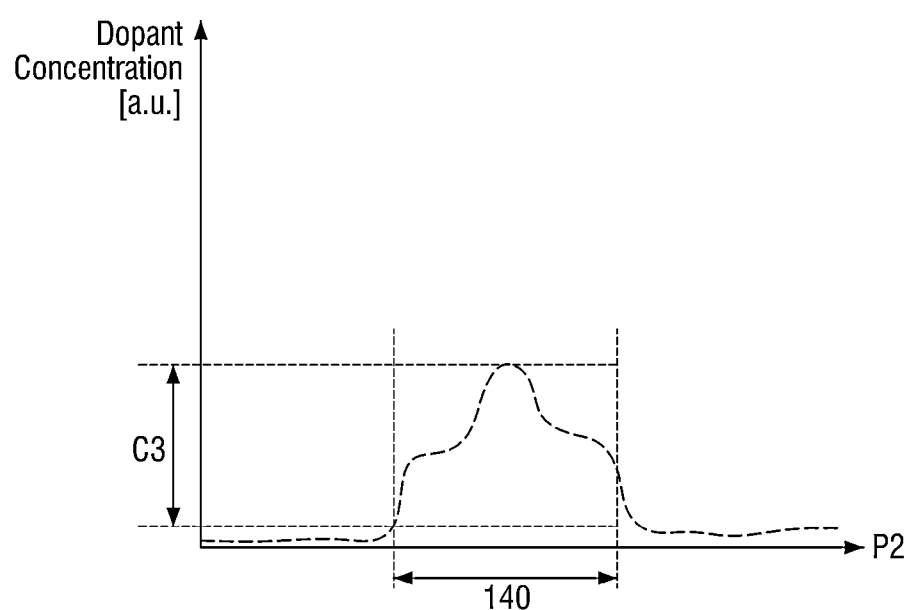
FIGS. 17A and 17B are graphs for explaining a concentration of a dopant of the semiconductor device according to some example embodiments.
Figure 17B:
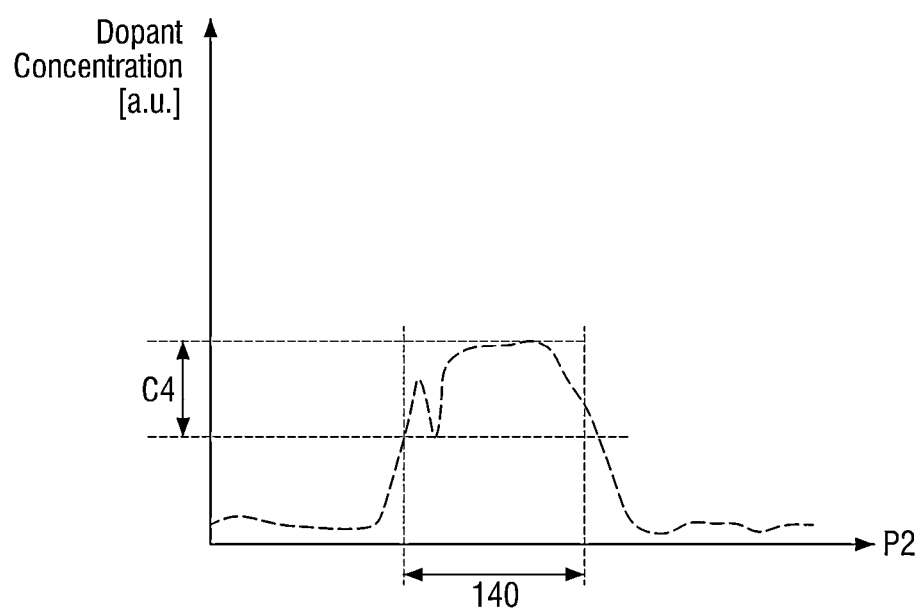

FIGS. 16A and 17A are graphs showing the concentration of the dopant in the storage contact which is not irradiated with laser. FIGS. 16B and 17B are graphs showing the concentration of dopant in the storage contact irradiated with laser according to the method for fabricating the semiconductor device according to some example embodiments. The concentrations may be measured, e.g. measured with a secondary ion mass spectroscopy (SIMS) tool; however, example embodiments are not limited thereto.

Referring to FIG. 2, an X-axis in FIG. 16 represents a position P1 in a direction from the upper face 160u of the storage contact 140 toward the substrate 100. An X-axis in FIG. 17 represents a position P2 in the storage contact 140 in the second direction DR2. A Y-axis in FIGS. 16 and 17 represents a dopant concentration. The unit of distance and dopant may be an arbitrary unit (a.u.) that shows only the relative magnitude, e.g. the relative order of magnitude.

Referring to FIG. 16A, a concentration deviation of the dopant in the direction from the upper face 160u of the storage contact 140 to the substrate 100 in the storage contact 140 is a first concentration C1. The concentration of the dopant may be reduced, for example, by defects formed inside the storage contact 140.

Referring to FIG. 16B, the concentration deviation of the dopant in the direction from the upper face 160u of the storage contact 140 to the substrate 100 in the storage contact 140 is a second concentration C2. The first concentration C1 is greater than the second concentration C2, e.g. may be greater by one or more orders of magnitude. For example, because the storage contact 140 of the semiconductor device according to some example embodiments is irradiated with laser, defects in the storage contact 140 can be removed. As a result, the concentration of the dopant may be made more uniform.

Referring to FIG. 17A, the concentration deviation of the dopant in the storage contact 140 in the second direction DR2 is a third concentration C1. Referring to FIG. 17B, the concentration deviation of the dopant in the storage contact 140 is a fourth concentration C4. The third concentration C3 is greater than the fourth concentration C4.

For example, according to the method for fabricating the semiconductor device according to some example embodiments, the storage contact 140 irradiated with a laser is rapidly quenched after being melted to become a single crystallization, and may have the same crystal orientation as the active region (ACT of FIG. 1) of the substrate 100. Accordingly, the dopants can be activated, and the dopants may be more evenly distributed inside the storage contact 140.

In concluding the detailed description, those of ordinary skill in the art will appreciate that many variations and modifications may be made to example embodiments without substantially departing from the principles of example embodiments. Therefore, the disclosed example embodiments are used in a generic and descriptive sense only and not for purposes of limitation.

What is claimed is:

1. A method for fabricating a semiconductor device, the method comprising:
    forming a bit line structure on a substrate, the substrate including an element separation film;
    forming a trench in the element separation film and in the substrate on at least one side of the bit line structure, the trench including a first portion in the element separation film and a second portion in the substrate, a bottom face of the first portion above a bottom face of the second portion;
    forming a storage contact in the trench;
    irradiating the storage contact with a laser to recrystallize the storage contact; and
    forming a landing pad on the storage contact, wherein the storage contact is a single crystal storage contact.

2. The method for fabricating the semiconductor device of claim 1, wherein a crystal orientation of the storage contact is same as a crystal orientation of the substrate.

3. The method for fabricating the semiconductor device of claim 1, wherein the storage contact includes silicon, and a wavelength of the laser is 254.6 nm or more and 1136.7 nm or less.

4. The method for fabricating the semiconductor device of claim 1, wherein a wavelength of the laser is greater than or equal to a wavelength corresponding to a band gap of a material included in the storage contact and is less than or equal to 1136.7 nm.

5. The method for fabricating the semiconductor device of claim 1, wherein an upper face of the storage contact before irradiating the storage contact with the laser is above an upper face of the storage contact after irradiating the storage contact with the laser.

6. The method for fabricating the semiconductor device of claim 1, wherein the substrate includes a plurality of chip regions and a scribe lane region between the plurality of chip regions, and
    the irradiating of the storage contact with the laser includes,
        using a laser mask including an opening for exposing at least a part of the plurality of chip regions on the substrate, and
        irradiating at least the part of the plurality of chip regions exposed by the opening with the laser.

7. The method for fabricating the semiconductor device of claim 6, wherein an edge of the opening is on the scribe lane region.

8. The method for fabricating the semiconductor device of claim 6, wherein the substrate further includes a dummy region, and an edge of the opening is on the dummy region.

9. The method for fabricating the semiconductor device of claim 6, wherein a dummy region includes a test element group region and an alignment key.

10. The method for fabricating the semiconductor device of claim 1, wherein the storage contact before irradiating the storage contact with the laser includes a defect, and the defect is removed by irradiating the storage contact with the laser.

11. The method for fabricating the semiconductor device of claim 1, wherein the second portion includes a first side walls, which connect the bottom face of the first portion and the bottom face of the second portion, and a second side walls, which opposes to the first side walls, and
    at least of the second side walls of the second portion is defined the element separation film.

12. A method for fabricating a semiconductor device, the method comprising:
    forming a bit line structure on a substrate, the substrate including a first element separation film and a second element separation film adjacent to the first element separation film;
    forming a trench including a first portion in the first element separation film and a second portion in the substrate between the first element separation film and the second element separation film, a bottom face of the first portion above a bottom face of the second portion, connecting side walls for connecting the bottom face of the first portion with the bottom face of the second portion defined by the first element separation film;
    forming a pre storage contact filing the trench;
    irradiating the pre storage contact with a laser to form a storage contact; and
    forming a landing pad on the storage contact, wherein a wavelength of the laser is greater than or equal to a wavelength corresponding to a band gap of a material included in the pre storage contact.

13. The method for fabricating the semiconductor device of claim 12, wherein at least a part of the side walls of the trench is defined by the second element separation film.

14. The method for fabricating the semiconductor device of claim 12, wherein an upper face of the first element separation film is below an upper face of the second element separation film.

15. The method for fabricating the semiconductor device of claim 12, wherein the substrate and the storage contact include single crystal silicon.

16. The method for fabricating the semiconductor device of claim 15, wherein a crystal orientation of the substrate is same as a crystal orientation of the storage contact.

17. A method for fabricating a semiconductor device, the method comprising:
  forming an insulating pattern on a substrate, the substrate including an element separation film and an active region;
  forming a bit line contact penetrating the insulating pattern to connect to the active region;
  forming a bit line structure on the substrate, the bit line structure including a first bit line structure on the bit line contact and a second bit line structure on the insulating pattern overlapping to the element separation film, the first bit line structure connected to the active region through the bit line contact;
  forming a trench on at least one side of the bit line structure, the trench including a first portion in the element separation film adjacent to the first portion and a second portion in the active region, a bottom face of the first portion above a bottom face of the second portion;
  forming a storage contact filling the trench;
  irradiating the storage contact with a laser to recrystallize the storage contact;
  forming a landing pad on the storage contact; and
  forming an information storage element on the landing pad,
  wherein the substrate and the storage contact include single crystal silicon.

18. The method for fabricating the semiconductor device of claim 17, wherein an upper face of the storage contact placed above an upper face of the bit line contact.

19. The method for fabricating the semiconductor device of claim 17, wherein the bottom face of the second portion of the trench being above a bottom face of the bit line contact.

20. The method for fabricating the semiconductor device of claim 17, wherein a bottom face of the insulating pattern is in contact with the storage contact.

* * * * *